(12) United States Patent
Yumoto et al.

(10) Patent No.: US 7,358,704 B2
(45) Date of Patent: Apr. 15, 2008

(54) CRITICAL STATE ESTIMATION SYSTEM AND METHOD FOR SECONDARY CELLS

(75) Inventors: Daijiro Yumoto, Zama (JP); Hideo Nakamura, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 280 days.

(21) Appl. No.: 11/121,037

(22) Filed: May 4, 2005

(65) Prior Publication Data
US 2005/0194976 A1   Sep. 8, 2005

(51) Int. Cl.
*H02J 7/00* (2006.01)
(52) U.S. Cl. ............. 320/132; 320/119; 320/133; 324/427; 324/433; 702/63; 702/182
(58) Field of Classification Search ............ 324/427, 324/433; 320/119, 132, 133; 702/182, 63
See application file for complete search history.

(56) References Cited

U.S. PATENT DOCUMENTS

| | | | | |
|---|---|---|---|---|
| 5,321,627 | A * | 6/1994 | Reher | 702/63 |
| 6,160,380 | A * | 12/2000 | Tsuji et al. | 320/132 |
| 6,388,447 | B1 * | 5/2002 | Hall et al. | 324/426 |
| 6,417,668 | B1 * | 7/2002 | Howard et al. | 324/426 |
| 6,850,038 | B2 * | 2/2005 | Arai et al. | 320/132 |
| 2002/0130637 | A1 * | 9/2002 | Schoch | 320/132 |
| 2002/0193953 | A1 * | 12/2002 | Hoenig et al. | 702/63 |
| 2003/0006735 | A1 * | 1/2003 | Kawakami et al. | 320/133 |
| 2003/0112011 | A1 * | 6/2003 | Guiheen et al. | 324/429 |
| 2003/0146737 | A1 * | 8/2003 | Kadouchi et al. | 320/132 |
| 2003/0184307 | A1 * | 10/2003 | Kozlowski et al. | 324/427 |
| 2003/0195719 | A1 * | 10/2003 | Emori et al. | 702/183 |
| 2004/0100227 | A1 * | 5/2004 | Yumoto et al. | 320/151 |
| 2005/0040789 | A1 * | 2/2005 | Salasoo et al. | 320/119 |
| 2006/0091862 | A1 * | 5/2006 | Melichar | 320/132 |

FOREIGN PATENT DOCUMENTS

| | | |
|---|---|---|
| JP | 09-171063 A | 6/1997 |
| JP | 2003-075517 A | 3/2003 |
| JP | 2003-075518 A | 3/2003 |
| JP | 2003-185719 A | 7/2003 |

(Continued)

*Primary Examiner*—Bao Q. Vu
*Assistant Examiner*—Jue Zhang
(74) *Attorney, Agent, or Firm*—Foley & Lardner LLP

(57) ABSTRACT

For estimation of a critical state of a performance under a working condition of a secondary cell, in consideration of an internal resistance of the cell, a variable data provider provides variable data on the performance, including a first data on a variant of the performance, a second data on a current of the cell, and an estimated third data on a dynamic characteristic of the internal resistance, a specified data provider provides specified data on the cell, including a fourth data on a permissible range of the variant under the prescribed working condition, and exact data on the dynamic characteristic, and a critical state estimator processes the variable and specified data for estimation of the critical state, and has an internal resistance setter to process the second and third data to set exact data as a function of second data defining the dynamic characteristic, and an estimating element to process the first, fourth, and exact data to estimate the critical state.

13 Claims, 13 Drawing Sheets

FOREIGN PATENT DOCUMENTS

| | | |
|---|---|---|
| JP | 2003-346914 A | 12/2003 |
| JP | 2003-346915 A | 12/2003 |
| JP | 2004-014231 A | 1/2004 |
| JP | 2004-079472 A | 3/2004 |
| JP | 2004-178848 A | 6/2004 |
| JP | 2004-191113 A | 7/2004 |
| JP | 2004-245627 A | 9/2004 |
| JP | 2004-264126 A | 9/2004 |

* cited by examiner

SD: $V_{max}, V_{min}$
VD: $V_0, \theta, T$
CP: $P_{in}, P_{out}$

CRITICAL STATE ESTIMATION SYSTEM AND METHOD FOR SECONDARY CELLS

BACKGROUND OF THE INVENTION

1. Field of the Invention

The present invention relates to a critical state estimation system for secondary cells, and a critical state estimation method for secondary cells.

In particular, the invention relates to a critical state estimation system and critical state estimation method which are each adapted for estimation of a "critical state" in terms of a "boundary of a permissible range" of a performance (e.g. current or power input/output performance) of a secondary cell, under a prescribed working condition of the secondary cell.

The "critical state" to be estimated may be:

"inputtable current ($I_{in}$)" or "outputtable current ($I_{out}$)" that defines a limiting boundary of a permissible range for current to be conducted to or from the secondary cell; or "inputtable power ($P_{in}$)" or "outputtable power ($P_{out}$)" that defines a limiting boundary of a permissible range for power to be input (or charged) to, or output (or discharged) from, the secondary cell.

2. Description of the Related Art

A power estimator for a battery has been disclosed in Japanese Patent Application Laid-Open Publication No. 9-171063 (hereafter called "JPA'063").

In this estimator, based on measurements of a supply current I and a terminal voltage V of the battery, a discharge characteristic of the battery is defined as a relationship between current I and voltage V, by an expression of straight line, such that $V = R \times I + V_0$ . . . (exp-1: exp=expression), where, R: an internal resistance of the battery, which is calculated as a slope of the straight line of I-V relationship, and $V_o$: an open-circuit voltage, i.e., the terminal voltage V with the current I cut off to a zero, that represents an emf (electromotive force) of the battery.

The open-circuit voltage $V_o$ is calculated as a V-intercept of the I-V straight line. Then, based on the current I and a temperature T of the battery, a permissible minimum voltage $V_{min}$ for a guaranteed service life of the battery is calculated, which is substituted for the voltage V in the expression of I-V straight line to obtain a maximum $I_{max}$ of the current I.

Then, outputtable power P of the battery is estimated, such that $$P = V_{min} \times I_{max} \quad \text{(exp-2)}.$$

SUMMARY OF THE INVENTION

In the JPA'063, the slope (i.e. internal resistance R) and intercept (i.e. open-circuit voltage $V_o$) of the I-V straight line are calculated from measured values of current I and voltage V between two time points during a discharge of the battery, assuming them (R, $V_o$) to be constant between the two time points, without consideration to exact variations depending on the current I, resulting in a low-precision estimation of the outputtable power P.

However, in practical use of a typical secondary cell, such parameters (R, $V_o$) are always varied with time, depending on the magnitude (as amplitude, i.e. absolute I) of "a charge current I to the cell or a discharge current I from the cell" (hereafter sometimes collectively called "cell current" or "battery current").

In particular, the internal resistance of secondary cell exhibits significant, sometimes non-linear, variations between a normal region of a cell current I (assumed positive, i.e. I>0, for charge, or negative, i.e. I<0, for discharge) and an extreme region thereof, where the current I is increased to an end for charge or discharge of permissible power.

This may be the case of JPA'063, where the internal resistance R calculated for a measured region of current I is based on to calculate the maximum current $I_{max}$, but the resistance R may have different values for greater currents, resulting in an erroneous maximum current.

The present invention is made with such points in view. It therefore is an object of the invention to provide a critical state estimation system and a critical state estimation method, which are each adapted for estimation of a "critical state" of performance under a prescribed working condition of a secondary cell, such as inputtable or outputtable current ($I_{in}$, $I_{out}$) or inputtable or outputtable power ($P_{in}$, $P_{out}$), allowing for a matching high-precision estimation, in consideration of a practical characteristic of an internal resistance of the secondary cell, which is dynamic and sometimes non-linear.

To achieve the object, according to an aspect of the invention, there is provided a critical state estimation system adapted for estimation of a critical state of a performance under a prescribed working condition of a secondary cell, in consideration of an internal resistance of the secondary cell, the system comprising:

a variable data provider configured to provide a set of variable data on the performance, including
    an available first data on a variant of the performance,
    an available second data on a current of the secondary cell, and
    an estimated third data on a dynamic characteristic of the internal resistance; and a specified data provider configured to provide a set of specified data on the secondary cell, including
    a specified fourth data on a permissible range of the variant under the prescribed working condition, and
    a set of exact data on the dynamic characteristic; and a critical state estimator configured to process the set of variable data and the set of specified data for estimation of the critical state, the critical state estimator comprising
    an internal resistance setter configured to process the second data and the third data to set a subset of the set of exact data defining the dynamic characteristic, and
    an estimating element configured to process the first data, the fourth data, and the subset of exact data to estimate the critical state.

To achieve the object, according to another aspect of the invention, there is provided a critical state estimation method adapted for estimation of a critical state of a performance under a prescribed working condition of a secondary cell, in consideration of an internal resistance of the secondary cell, the method comprising:

providing a set of variable data on the performance, including
    an available first data on a variant of the performance,
    an available second data on a current of the secondary cell, and
    an estimated third data on a dynamic characteristic of the internal resistance; and providing a set of specified data on the secondary cell, including
    a specified fourth data on a permissible range of the variant under the prescribed working condition, and a set of exact data on the dynamic characteristic; and processing the set of variable data and the set of specified data for estimation of the critical state, the processing comprising processing the second data and the third data to set a subset of the set of exact data defining the dynamic characteristic, and processing the first data, the fourth data, and the subset of exact data to estimate the critical state.

In the first or second aspect, the critical state may preferably comprise one of an inputable current, an outputtable current, inputtable power, and outputtable power of the secondary cell.

BRIEF DESCRIPTION OF THE ACCOMPANYING DRAWINGS

The above and further objects and novel features of the present invention will more fully appear from the following detailed description when the same is read in conjunction with the accompanying drawings, in which.

DETAILED DESCRIPTION OF THE PREFERRED EMBODIMENTS

Figure 1:
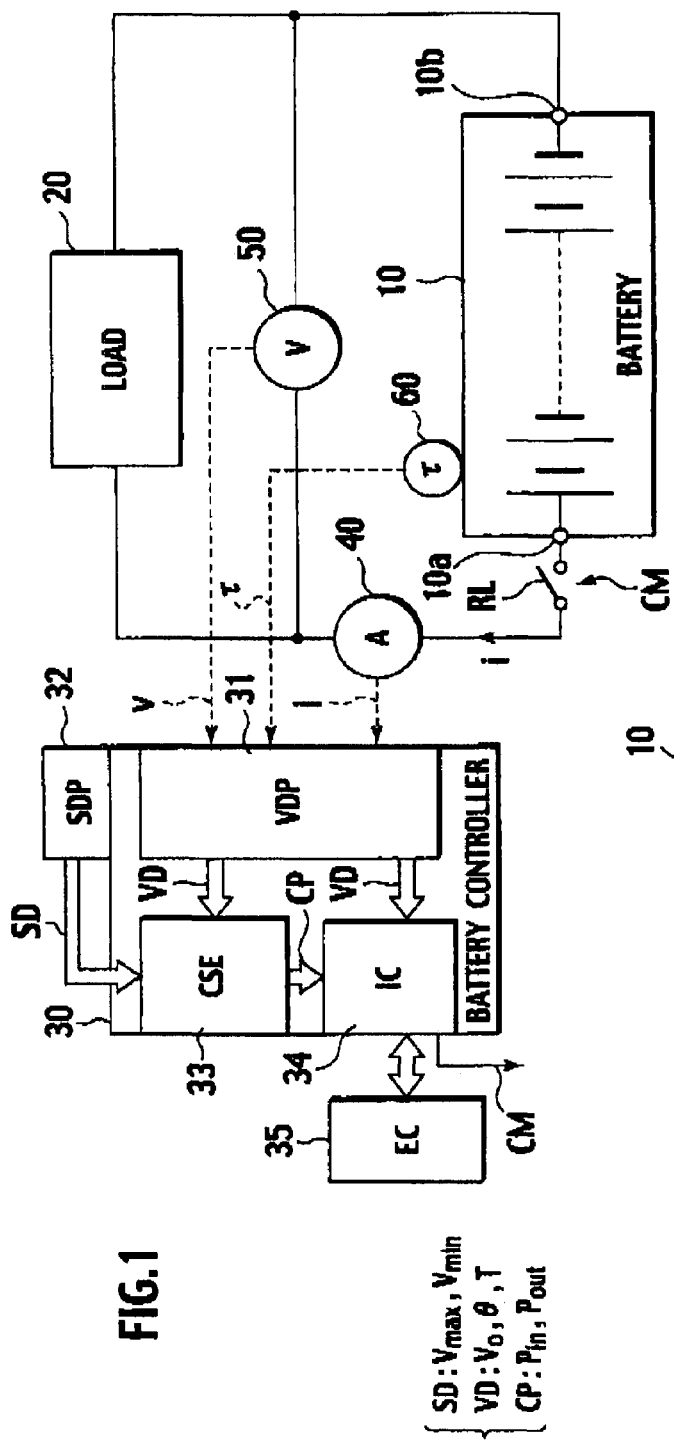
FIG. 1 is a block diagram of a vehicular power supply system including a battery controller adapted to serve as a critical state estimation system according to a first embodiment of the invention.

There will be detailed below the preferred embodiments of the present invention with reference to the accompanying drawings. Like members are designated by like reference characters.

FIG. 1 shows, in block diagram, a vehicular power supply system in which dc (direct current) electric power is supplied from a battery 10 to a power-consuming, generative, and/or regenerative load 20, under control from a battery controller 30, which is a microcomputer partially adapted to serve as a critical state estimation system according to a first embodiment of the invention.

The battery 10 is configured as a secondary cell with terminals 10$a$, 10$b$ at both ends, and with a number of unit cells connected serial or serial-parallel in between, which have their emf's and internal resistances.

In FIG. 1, the block of load 20 represents a set of local loads mounted in a vehicle, which may include a vehicle-driving regenerative electric motor, a local battery as an auxiliary charge accumulator, and/or a fuel cell system provided with a power-generating fuel cell and auxiliary equipment for utility supply thereto. The load 20 thus includes unshown circuitry for power distribution to respective local loads, which circuitry may include a relay circuit controlled by commands from the controller 30.

The battery 10 is connected at the terminals 10$a$, 10$b$ to the load 20, via a power supply line including a switching relay RL depicted in FIG. 1, which is controlled by a switching command CM from the controller 30.

The power supply line has, upstream the circuitry for power distribution, a current meter or detector 40 for measuring or detecting a supply current i from the battery 10, as a current conducted to or from the battery 10, and a voltage meter or detector 50 for measuring or detecting a supply voltage v from the battery 10, as a terminal voltage in terms of a potential difference across (i.e. between terminals 10$a$, 10$b$ of) the battery 10. Moreover, an average or representative temperature τ (tau) of battery 10 is detected by a battery temperature sensor 60.

It is assumed that the current i as well as the voltage v has a positive value (i>0, v>0) when the battery 10 is charged, or a negative value (i<0, v<0) when the battery 10 discharges.

As shown in FIG. 1, the battery controller 30 has a variable data provider (VDP) 31, a specified data provider (SDP) 32, a critical state estimator (CSE) 33, and an internal controller (IC) 34 interfaced with an external controller (EC) 35, which may be a vehicle controller or part thereof.

As for the embodiment, the battery controller 30 may be implemented with a microcomputer provided with a processor, and necessary peripherals including interfaces and memory elements (i.e. memory devices or allotted memory regions) having software resources stored therein, such as applications, files, and data.

The variable data provider (VDP) 31 is interfaced with a set of sensors or detectors (including current and voltage detectors 40, 50, and temperature sensor 60), for sampling results of their detection (e.g. analog current i, voltage v, and temperature τ (tau)) as dynamic variants (e.g. digital current I, voltage V, and temperature T (tau) that effectively represent the current i, voltage v, and temperature τ, respectively), of which data are stored every control cycle in a row or column of a matrix-formatted memory region of battery controller 30, as "sampled basic variant data" to be read (by internal controller 34) as necessary and updated (by internal controller 34) after lapse of a predetermined number of cycles.

The variable data provider (VDP) 31 is configured to process read variants (e.g. I, V, T (tau)), for calculations to estimate multi-dimensional dynamic parameters of battery 10 (e.g. a resistance parameter θ that represents a total internal resistance which is non-linear, and an emf parameter $V_0$ that represents an offset term of total emf which may be linear), of which data also are stored every control cycle in a memory region of battery controller 30, as "estimated basic parameter data" to be read as necessary (by internal controller 34) and updated (by internal controller 34) after lapse of a predetermined number of cycles.

For estimation of non-linear parameter (e.g. θ), the variable data provider (VDP) 31 may be adapted to execute a piecewise convergent operation, in which particular "sampled basic variant data" (e.g. I) and data on circumstances (e.g. SOC: state of charge of battery 10) are piecewise ranked or classified every cycle, to thereby determine a category of current-cycle attribution (e.g. tendency, bias, and/or boundary of variation) of non-linear parameter in concern.

The "estimated basic parameter data" may be formatted with a place of categorization. For non-linear parameter (e.g. θ), this data place may have a non-zero category data, so that the "basic parameter data" can have a defined attribution when read to be processed. A categorized data map of attribution may be stored in a memory region of controller 30. In "basic parameter data" of linear parameter, the above-noted place may be left blank or given a zero category data, so that the "parameter data" can be simply identified to be read.

For effective parameter estimation, the variable data provider (VDP) 31 may receive, from or via the internal controller (IC) 34, a variety of circumstance data including current-cycle data on "working condition" of battery 10 (e.g. SOC, controlled state of relay circuitry, and/or characteristics of load 20 or part thereof) and/or a history of battery 10 (e.g. dated records of manufacture, custody, application, installation, routine maintenance, and/or any significant event else), which may be processed, alone or together or in combination with associated variant (e.g. I), for a logical or numerical computation to rank the degree of deterioration, severity of condition of use, and/or absolute magnitude of variant (e.g. I), as necessary for a compensatory categorization programmed in a file in use.

The compensatory categorization may be executed, not simply of such parameters (e.g. θ) that have inherently been assumed to be non-linear even before taking the circumstance data into account, but also of such parameters (e.g. $V_0$) that may have been assumed linear till then and may then be assumed quasi-nonlinear in accordance with a categorization map stored in a memory region of controller 30.

The variable data provider (VDP) 31 follows a request from internal controller (IC) 34, to provide a combination of "variant data" and "parameter data" as a set of variable data (VD) representing a dynamic characteristic of battery 10 in a current cycle.

For the embodiment, the variable data provider (VDP) 31 may be implemented with a set of samplers, a set of memory elements, and one or more computer-processible files. The variable data (VD) may include, $V_o$, and θ, and may additionally involve T(tau), category data, and/or attribution data, as necessary.

The specified data provider (SDP) 32 has a set of specified data (SD) stored therein, and is adapted, upon a request from or via the internal controller (IC) 34 or external controller (EC) 35, to provide a corresponding subset of the set of data (SD).

Figure 4:
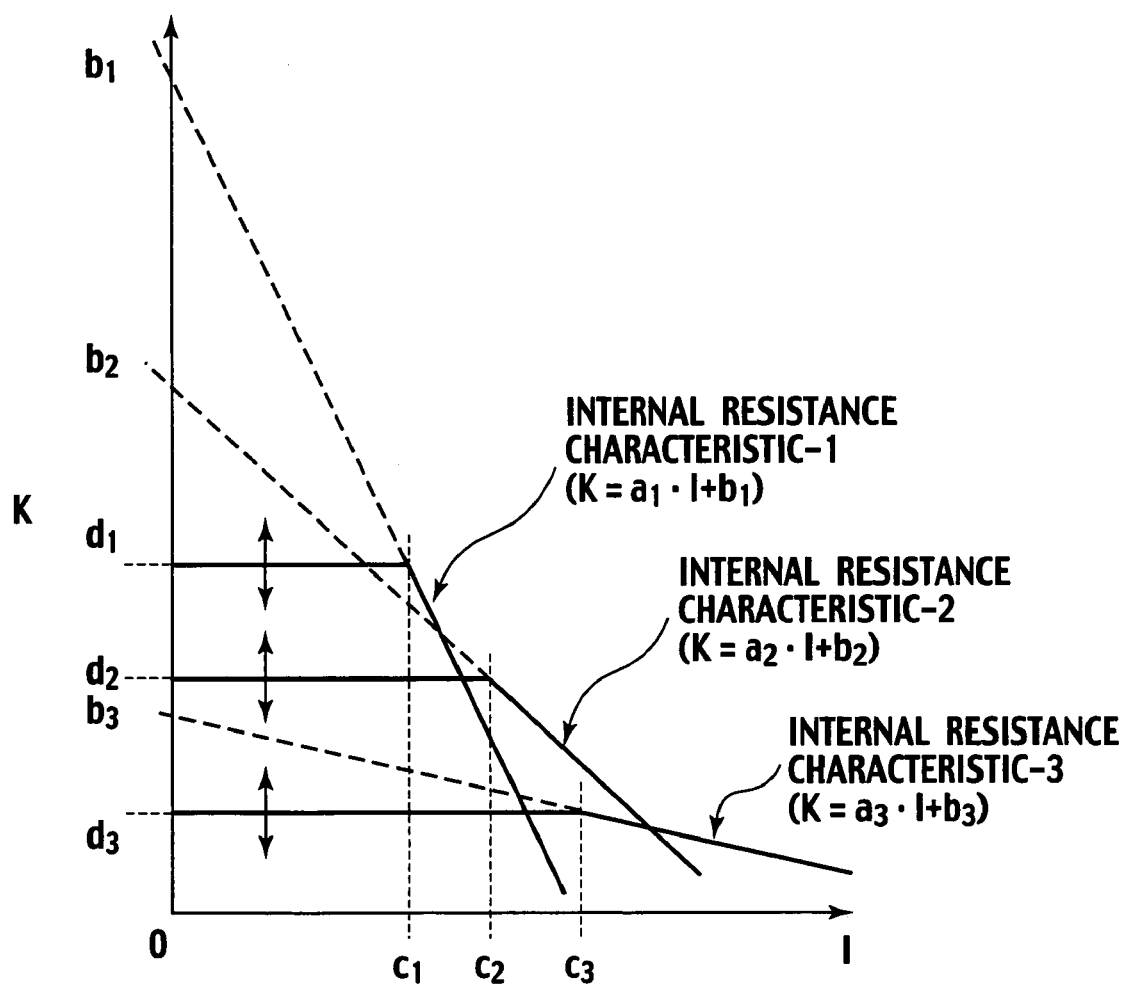
FIG. 4 is a graph of an internal resistance vs. current amplitude field having mapped thereon non-linear characteristics of internal resistance of the battery of FIG. 3.

It is noted that the set of specified data (SD) includes a set of multi-dimensional data formatted in a vector or matrix form and/or mapped on an adequate two-dimensional field (e.g. on I-K plane), and representing a real or exact multi-variable (e.g. I/T/SOC-dependant) characteristic of the internal resistance of battery 10, which will be separately described in conjunction with FIG. 4.

For the embodiment, the specified data provider (SDP) 32 may be implemented with memory elements, and one or more computer-processible files. The specified data (SD) may include data on minimum and maximum voltages $V_{min}$ and $V_{max}$ specified to be permissible under prescribed working conditions of battery 10, for a practical performance to be achieved with an ensured protection of battery 10, in consideration of conditions of use and/or history of battery 10.

The specified data may involve a map of design or empirical data on permissible, ranges of variants (e.g. I, V) and/or parameters ($V_0$, θ) for a respective prescribed working condition, as well as maps of standard data on criteria or requirements for typical events in life of battery 10 (e.g. manufacture, custody, application, installation, and/or routine maintenance), and/or average or standard data on deterioration of battery 10.

The critical state estimator (CSE) 33 is configured to: process variable data (VD) and specified data (SD) input thereto from the variable data provider (VDP) 31 and specified data provider (SDP) 32, for estimating a "critical state" in terms of a boundary (e.g. $I_{in}$, $P_{in}$, $I_{out}$, $P_{out}$) of a permissible range of a performance (e.g. current or power input or output performance) in current cycle under a prescribed working condition of the battery 10; and store data (CP) on results of such estimation in a memory region of controller 30.

More specifically, the critical state estimator (CSE) 33 is configured for (among other operations in current cycle) a sequence of operations to:

stepwise execute a combination of calculations (based on VD and SD) to estimate critical current values $I_{in}$ (inputtable current) and $I_{out}$ (outputtable current) under prescribed working conditions, having data on estimated $I_{in}$ and $I_{out}$ stored in a memory region of controller 30, to be updated after lapse of a predetermined number of cycles, a combination of calculations (based on SD, $I_{in}$ and $I_{out}$) to estimate critical power values $P_{in}$ (inputtable power) and $P_{out}$ (outputtable power), and having data on estimated $P_{in}$ and $P_{out}$ stored in a memory region of controller 30, to be updated after lapse of a predetermined number of cycles; and provide a set of critical power data (CP) representing $P_{in}$ and $P_{out}$ in accordance with a command or request from the internal controller (IC) 34.

For the embodiment, the critical state estimator (CSE) 33 may be implemented with memory elements, and one or more computer-processible files. The critical power data (CP) normally includes data on $P_{in}$ and $P_{out}$ in current cycle, but may involve those ($P_{in}$, $P_{out}$) in previous or antecedent cycle upon request, and/or may additionally or simply involve data on $I_{in}$ and $I_{out}$, data on $V_{min}$ and $V_{max}$, and/or any associated data else (e.g. SD, VD) in current and/or previous or antecedent cycle in accordance with a request from internal controller (IC) 34.

The internal controller (IC) 34 is configured to process critical power data (CP) and variable data (VD) input thereto from the critical state estimator (CSE) 33 and variable data provider (VDP) 31, as well as specified data (SD) directly or indirectly given thereto from the specified data provider (SDP) 32, as necessary for cooperation with the external controller (EC) 35 for, e.g., decisions to provide various commands to govern the power supply system of FIG. 1, including the switching command CM to the relay RL.

For the embodiment, the internal controller (IC) 34 may be implemented as a substantial hardware portion (except for samplers of VDP) of the battery controller 30, with a central processing unit and necessary peripherals including memories having software resources stored therein, such as an operating system, one or more applications, a computer-processible control file, associated files (e.g. VDP, SDP, CSE), and data (e.g VD, SD, CP).

Figure 2A:
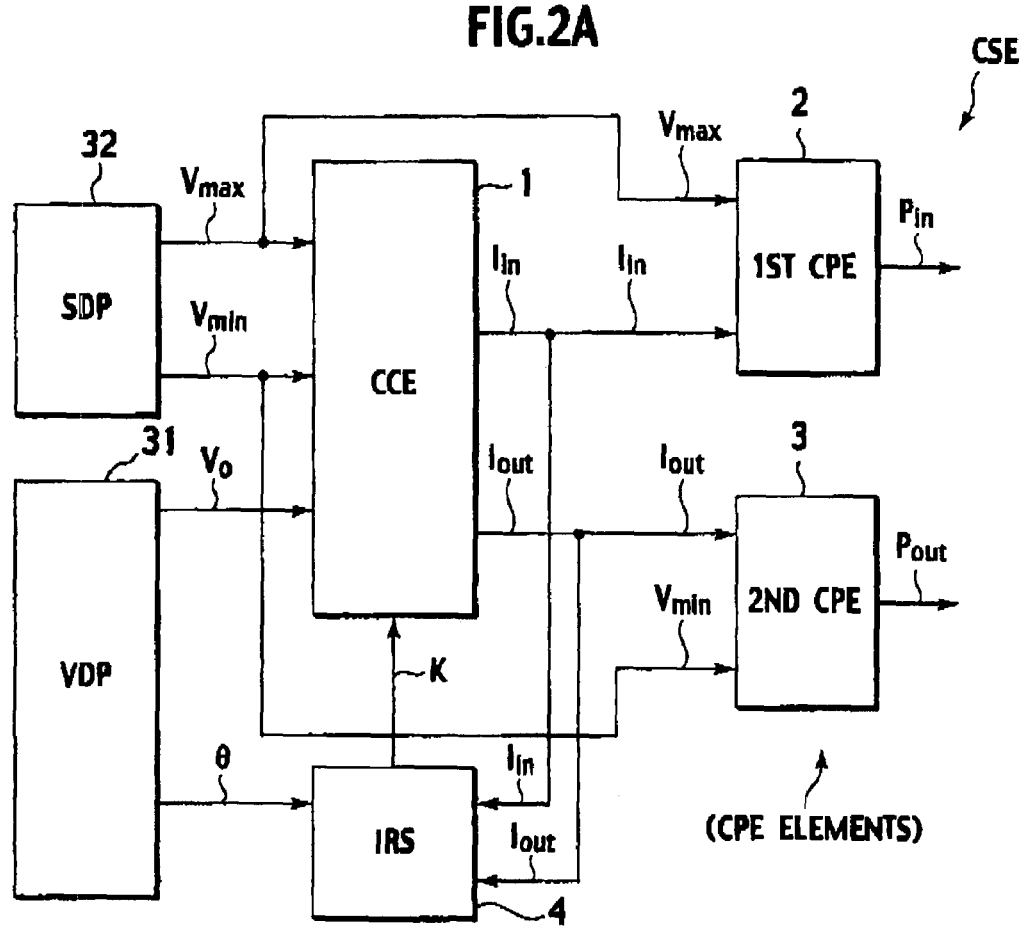
FIG. 2A is a block diagram of an essential portion of a critical state estimator of the battery controller of FIG. 1.

FIG. 2A shows in block diagram an essential portion of the critical state estimator (CSE) 33 that is addressed to estimation of inputtable current $I_{in}$ and power $P_{in}$ and outputtable current $I_{out}$ and power $P_{out}$.

The critical state estimator (CSE) 33 is configured with: an internal resistance setter (IRS) 4 interfaced with the variable data provider (VDP) 31; a critical current estimator (CCE) 1 interfaced with the variable data provider (VDP) 31, specified data provider (SDP) 32, and internal resistance setter (IRS) 4; and an array of critical power estimating (CPE) elements each respectively interfaced with the specified data provider (SDP) 32, and critical current estimator (CCE) 1.

It is noted that the internal resistance setter (IRS) 4 and the critical current estimator (CCE) 1 are configured to cooperatively constitute an estimation loop for estimating, in each control cycle, inputtable current $I_{in}$ and outputtable current $I_{out}$ as critical conditions defining a permissible range of current I under prescribed working conditions of battery 10.

The internal resistance setter (IRS) 4 is configured to:
input
variable data (VD) including current-cycle data on resistance parameter θ, from the variable data provider (VDP) 31, and
previous-cycle data (more specifically, set data before update in current cycle) on inputtable current $I_{in}$ and outputtable current $I_{out}$, from the critical current estimator (CCE) 1;
process input data for computation to estimate (or more specifically, for identification of a non-linear candidate derived from θ and calculation of a linear candidate from VD, $I_{in}$, and $I_{out}$, and for logical operations to select one candidate as) a current-cycle value of an internal resistance K of the battery 10;
store data on an estimated current-cycle value of internal resistance K, thereby updating current-cycle data of resistance K, thus setting the estimated value to resistance K; and
output data on the set value of resistance K, upon request.

The critical current estimator (CCE) 1 is configured to:
input
specified data (SD) including data on minimum and maximum voltages $V_{min}$ and $V_{max}$, from the specified data provider (SPD) 32,
variable data (VD) including current-cycle data on emf parameter $V_0$, from the variable data provider (VDP) 31, and
current-cycle data (more specifically, set data after update in current cycle) on internal resistance K, from the internal resistance setter (IRS) 4;
process input data for calculations to estimate current-cycle values of inputtable current $I_{in}$ and outputtable current $I_{out}$;
store data on estimated current-cycle values of inputtable current $I_{in}$ and outputtable current $I_{out}$, thereby updating current-cycle data of currents $I_{in}$ and $I_{out}$, thus setting the estimated values to currents $I_{in}$ and $I_{out}$; and
output data on thus set value of $I_{in}$ and/or $I_{out}$, upon request.

The array of critical power estimating (CPE) elements includes a first critical power estimator ($1^{st}$ CPE) 2, and a second critical power estimator ($2^{nd}$ CPE) 3.

The first critical power estimator ($1^{st}$ CPE) 2 is configured to receive: data on maximum voltage $V_{max}$ from the specified data provider (SPD) 32, and data on inputtable current $I_{in}$ from the critical current estimator (CCE) 1; process received data to determine inputtable power $P_{in}$; and provide data on thus determined inputtable power $P_{in}$.

The second critical power estimator ($2^{nd}$ CPE) 3 is configured to: receive data on minimum voltage $V_{min}$ from the specified data provider (SPD) 32, and data on outputtable current $I_{out}$ from the critical current estimator (CCE) 1; process received data to determine outputtable power $P_{out}$; and provide data on thus determined outputtable power $P_{out}$.

Figure 3:
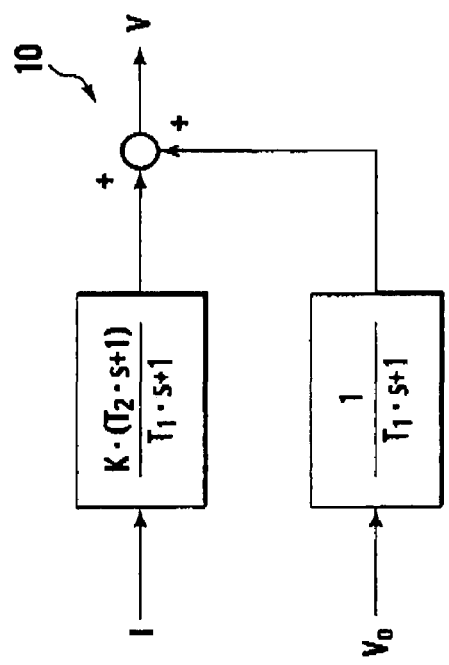
FIG. 3 is a block diagram of an equivalent model of a battery of the vehicular power supply system of FIG. 1.
Figure 2B:
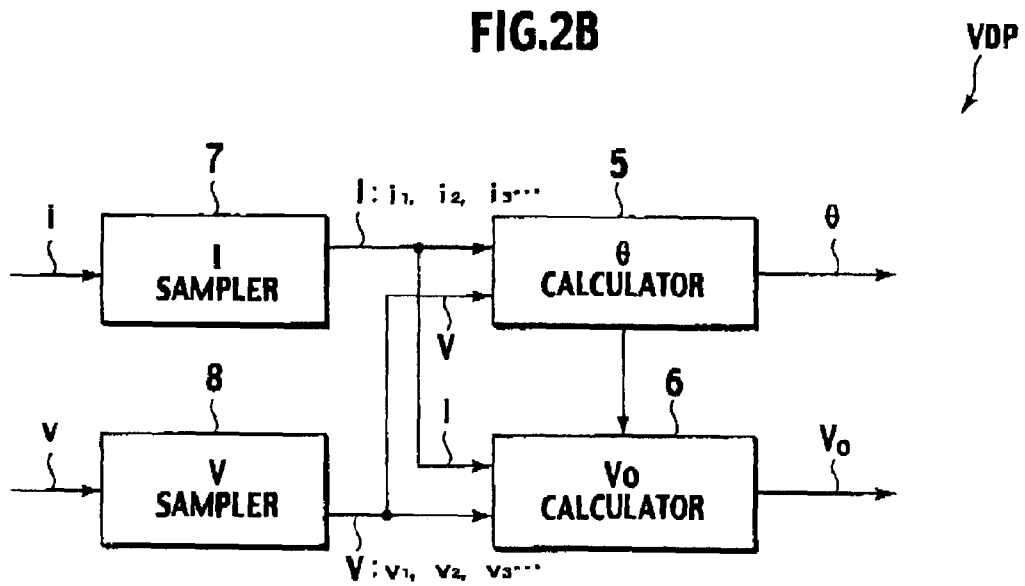
FIG. 2B is a block diagram of an essential portion of a variable data provider of the battery controller of FIG. 1.

FIG. 2B shows in block diagram an essential portion of the variable data provider (VDP) 31 that is adapted by a programmed "adaptive digital filter" for a concurrent estimation of whole unknown factors of θ and $V_o$ parameters (including internal resistance K itself), and FIG. 3 shows in block diagram an equivalent model of the battery 10 that corresponds to the adaptive digital filter.

The variable data provider (VDP) 31 is configured with:
a current (I) sampler 7 for sampling a battery current i (i.e. a magnitude of current conducted to or from the battery 10), to provide a data on current I : $i_1, i_2, i_3$, as a variant;
a voltage (V) sampler 8 for sampling a terminal voltage v of the battery 10, to provide a data on voltage V: $v_1, v_2, v_{34}$ as a variant;
a resistance parameter (θ) calculator 5 adapted to process a set of input variant data including data on current I and voltage V, for calculations to estimate the internal resistance parameter θ; and
an emf parameter ($V_o$) calculator 6 adapted to process a set of input variant and parameter data including data on current I, voltage V, and resistance parameter θ, for calculations to estimate the emf parameter $V_o$.

For the embodiment, the samplers 7 and 8 are each implemented with an adequate hardware interface, and the parameter calculators 5 and 6 are each implemented with a set of programmed instructions and stored data cooperatively constituting the above-noted "filter".

This filter is expressed, for the terminal voltage V of battery 10, as a sum (+) of a principal term for calculations of a contribution of current I, and an offset term for calculations of a contribution of emf or open-circuit voltage $V_o$, such that $$V = (I\text{-contribution term}) + (V_o\text{-contribution term}) \quad \text{(exp-3)}.$$

The I-contribution term is expressed as a multiplication between current I and a factor commensurate with the contribution of I, such that $$(I\text{-contribution term}) = (I\text{-contribution factor}) \times I \quad \text{(exp-4)}.$$

The $V_o$-contribution term is expressed as a multiplication between emf $V_o$ and a factor commensurate with the contribution of $V_o$, such that $$(V_o\text{-contribution term}) = (V_o\text{-contribution factor}) \times V_o \quad \text{(exp-5)}.$$

The I-contribution factor and $V_o$-contribution factor are each expressed in the form of a rational (or fractional) expression, such that $$(I\text{-contribution factor}) = \frac{B(s)}{A(s)}, \text{ and} \quad \text{(exp-6)}$$

$$(V_o\text{-contribution factor}) = \frac{1}{C(s)}, \quad \text{(exp-7)}$$

where, s is a Laplacian (i.e. Laplace operator), and
A(s), B(s), and C(s) are polynominal functions of degree n of s, such that $$A(s) = \sum_{k=0}^{n} a_k s^k, \quad \text{(exp-8a)}$$

$$B(s) = \sum_{k=0}^{n} b_k s^k, \text{ and} \quad \text{(exp-8b)}$$

$$C(s) = \sum_{k=0}^{n} c_k s^k, \quad \text{(exp-8c)}$$

while $a_1 \neq 0$, $b_1 \neq 0$, and $c_1 \neq 0$.

$$\text{Accordingly, } V = \frac{B(s)}{A(s)} I + \frac{1}{C(s)} V_o. \quad \text{(exp-9)}$$

For comprehensible embodiment, it is now assumed that the denominator C(s) of $V_o$-contribution factor equals that A(s) of I-contribution factor, providing that the open-circuit voltage $V_o$ of battery 10 has a relatively fast convergency, such as in a lithium ion cell.

$$\text{Thus, } V = \frac{B(s)}{A(s)} I + \frac{1}{A(s)} V_o. \quad \text{(exp-10)}$$

Assuming application of a stable low-pass filter to variants (I, V) of the adaptive filter, the degree n is reduced to 1, such that $$A(s) = a_1 s + a_0 \text{ and}$$

$$B(s) = b_1 s + b_0.$$

Letting $a_1 = T_1$, $a_0 = 1$, $b_1 = KT_2$ and $b_0 = K$, $$A(s) = T_1 s + 1 \text{ and}$$

$$B(s) = KT_2 s + K = K(T_2 s + 1),$$

where, $T_1$ and $T_2$ are time constants, and
K is internal resistance.

$$\text{Hence, } V = \frac{K(T_2 s + 1)}{T_1 s + 1} I + \frac{1}{T_1 s + 1} V_o. \quad \text{(exp-11)}$$

This filter is depicted as the equivalent model of FIG. 3, which is a (1-degree) reduction model having no polarized (positive-pole and negative-pole) terminals, but can exhibit relatively accurate dynamic (charge and discharge) characteristics of exact cells.

The battery model of expression-11 (as well as that of expression-9 or expression-10) involves coefficient parameters (i.e. factors $T_1$, $T_2$, and K), which can be concurrently estimated by substitution of given variants (sampled current I and voltage V subject to low-pass and/or band-path filtering), allowing for substitution of estimated parameters ($T_1$, $T_2$, K) and given variants (I, V) to estimate an open-circuit voltage $V_o$.

In the vehicular power supply system described, the variable data provider (VDP) 31 may preferably have detectors 40, 50, 60 as part of associated samplers (e.g. 7, 8).

In the battery controller 30, the critical state estimator (CSE) 33 may preferably have either or both of internal resistance and open-circuit voltage calculators 5, 6 as part of the internal resistance setter 4.

FIG. 4 shows, in a filed of two-dimensional coordinate plane defined by internal resistance K (on ordinate) and current amplitude I (on abscissa), a multi-dimensional non-linear dynamic characteristic of internal resistance K mapped thereon under conditions of constant battery temperature and constant SOC. Data on this map or K itself are separately prepared and stored in a memory of controller 30, to be read for substitution with a most approached estimation result.

In FIG. 4, the dynamic characteristic of K appears as a combination of three different characteristic lines for different temperatures:

an internal resistance characteristic-1 defined by a polygonal line, such that $$K = d_1 \text{ for } 0 \leq I \leq c_1, \text{ and}$$

$$K = a_1 I + b_1 \text{ for } c_1 < I;$$

an internal resistance characteristic-2 defined by a polygonal line, such that $$K = d_2 \text{ for } 0 \leq I \leq c_2, \text{ and}$$

$$K = a_2 I + b_2 \text{ for } c_2 < I; \text{ and}$$

an internal resistance characteristic-3 defined by a polygonal line, such that $$K = d_3 \text{ for } 0 \leq I \leq c_3, \text{ and}$$

$$K = a_3 I + b_3 \text{ for } c_3 < I,$$

where, $a_1$, $a_2$, and $a_3$ are slopes of straight line segments of polygonal lines in regions ($c_i < I$, i=1 to 3) of current amplitude I exceeding abscissas $c_1$, $c_2$, and $c_3$ of polygonal vertices, respectively, $b_1$, $b_2$, and $b_3$ are K-intercepts of extraporations of the straight line segments of polygonal lines, respectively, and $d_1$, $d_2$, and $d_3$ are levels of straight line segments of polygonal lines in regions ($I \leq c_i$) of current amplitude I not exceeding the abscissas $c_1$, $c_2$, and $c_3$ of polygonal vertices, respectively, while the levels $d_1$, $d_2$, and $d_3$ are each variable (as illustrated by vertical arrows) with a varying SOC.

The abscissa ($c_i$) of polygonal vertex is sometimes called "current amplitude reference value" herein.

Description is now made of deduction of an adaptive digital filter from the battery model of expression-11.

Assuming the open-circuit voltage $V_o$ as an integration (from an initial condition) of a magnitude of current I multiplied by a variable efficiency h=h(t), where t is a time, it so follows that $$V_o = \frac{h}{s} I. \qquad \text{(exp-12)}$$

Substituting this expression for $V_o$ in expression-11, $$V = \frac{K(T_2 s + 1)}{T_1 s + 1} I + \frac{1}{T_1 s + 1} \frac{h}{s} I, \qquad \text{(exp-13)}$$

which is reduced at the right side to a common denominator, and arranged in an extensive form at the denominator and numerator, so that $$V = \frac{K(T_2 s + 1)s + h}{(T_1 s + 1)s} I, \text{ and} \qquad \text{(exp-14)}$$

$$V = \frac{K T_2 s^2 + K s + h}{T_1 s^2 + s} I,$$

which is multiplied at both sides by the denominator ($T_1 s^2 + s$) and a stable low-pass filter $G_{lp}(s)$, so that $$G_{lp}(s)(T_1 s^2 + s) V = G_{lp}(s)(K T_2 s^2 + K s + h) I \qquad \text{(exp-15)},$$

where the low-pass filter $$G_{lp}(s) = \frac{1}{(ps + 1)^3},$$

where p is a time constant responsible for responsiveness of this filter.

Assuming current I and voltage V interfaced by adequate low-pass filters and/or band-path filters, a total of six observable values $I_1$ to $I_3$ and $V_1$ to $V_3$ are defined, such that $$\begin{bmatrix} I_1 & V_1 \\ I_2 & V_2 \\ I_3 & V_3 \end{bmatrix} = \begin{bmatrix} G_{lp}(s)I & G_{lp}(s)V \\ sG_{lp}(s)I & sG_{lp}(s)V \\ s^2 G_{lp}(s)I & s^2 G_{lp}(s)V \end{bmatrix}, \qquad \text{(exp-16)}$$

of which left-side elements are substituted as possible for corresponding right-side elements in expression-15, so that $$T_1 V_3 + V_2 = K T_2 I_3 + K I_2 + h I_1 \qquad \text{(exp-17)},$$

of which the first term ($T_1 V_3$) at the left side is transposed to the right side, and this side is transformed, so that $$V_2 = -T_1 V_3 + K T_2 I_3 + K I_2 + h I_1, \text{ and} \qquad \text{(exp-18)}$$

$$V_2 = [V_3 \quad I_3 \quad I_2 \quad I_1] \begin{bmatrix} -T_1 \\ K T_2 \\ K \\ h \end{bmatrix},$$

which has a product sum form (of observable values and unknown parameter factors) consistent with the form of an adaptive digital filter y, such that $$y = \omega^{trans} \theta \qquad \text{(exp-19)},$$

where,
$\omega$ and $\theta$ are matrices (as vectors), and
$\omega^{trans}$ is a transposed matrix of $\omega$.

Letting $y = V_2$, it is now assumed that $$\omega^{trans} = [V_3 \quad I_3 \quad I_2 \quad I_1], \text{ and}$$

$$\theta^{trans} = [-T_1 \quad K T_2 \quad K \quad h] \text{ or}$$

$$\theta = \begin{bmatrix} -T_1 \\ K T_2 \\ K \\ h \end{bmatrix}$$

Accordingly, filtered data ($I_1$, $I_2$, $I_3$, $V_2$, $V_3$) on current I and voltage V can be used for operation of the adaptive digital filter to estimate the unknown parameter vector $\theta$, which includes K.

For the embodiment, this filter operation does not simply use the method of least squares in which, if once converged, the estimation constitutes a bar against an accurate re-estimation even after a post-variation of parameter, but preferably employs a "method of trace gain convergency with upper and lower limits".

For expression-19, recurrence formulas are set such that $$\gamma(k) = \frac{\lambda_3}{1 + \lambda_3 \omega^{trans}(k) P(k-1) \omega(k)},$$

$$\theta(k) = \theta(k-1) - \gamma(k) P(k-1) \omega(k) [\omega^{trans}(k) \theta(k-1) - y(k)], \text{ and}$$

$$P(k) = \frac{1}{\lambda_1(k)} \left\{ P(k-1) - \frac{\lambda_3 P(k-1) \omega(k) \omega^{trans}(k) P(k-1)}{1 + \lambda_3 \omega^{trans}(k) P(k-1) \omega(k)} \right\},$$

where,
k is the number of cycles,
$\lambda_1$ is an initial set value, such that $0 < \lambda_1 < 1$, $\lambda_3$ is an initial set value, such that $0 < \lambda_3 < \infty$, P(0) is set to sufficiently great values,
$\theta(0)$ is set to sufficiently small non-zero values, and
$\lambda_1(k)$ represents a gain.

For effective convergence, the gain is limited at both sides, such that letting $$P(k) = \frac{1}{\lambda_1(k)} P'(k), \quad \text{(exp-20)}$$

$$\lambda_1(k) = \begin{cases} \dfrac{\text{trace}\{P'(k)\}}{\gamma_U} & \text{for} \quad \lambda_1 \leq \dfrac{\text{trace}\{P'(k)\}}{\gamma_U} \\ \lambda_1 & \text{for} \quad \dfrac{\text{trace}\{P'(k)\}}{\gamma_U} \leq \lambda_1 \leq \dfrac{\text{trace}\{P'(k)\}}{\gamma_L} \\ \dfrac{\text{trace}\{P'(k)\}}{\gamma_L} & \text{for} \quad \dfrac{\text{trace}\{P'(k)\}}{\gamma_L} \leq \lambda_1 \end{cases},$$

where, $\gamma_L$ and $\gamma_U$ are initial set values, and trace{ } means a trace (sum of diagonal elements) of a matrix in { }.

Figure 7:
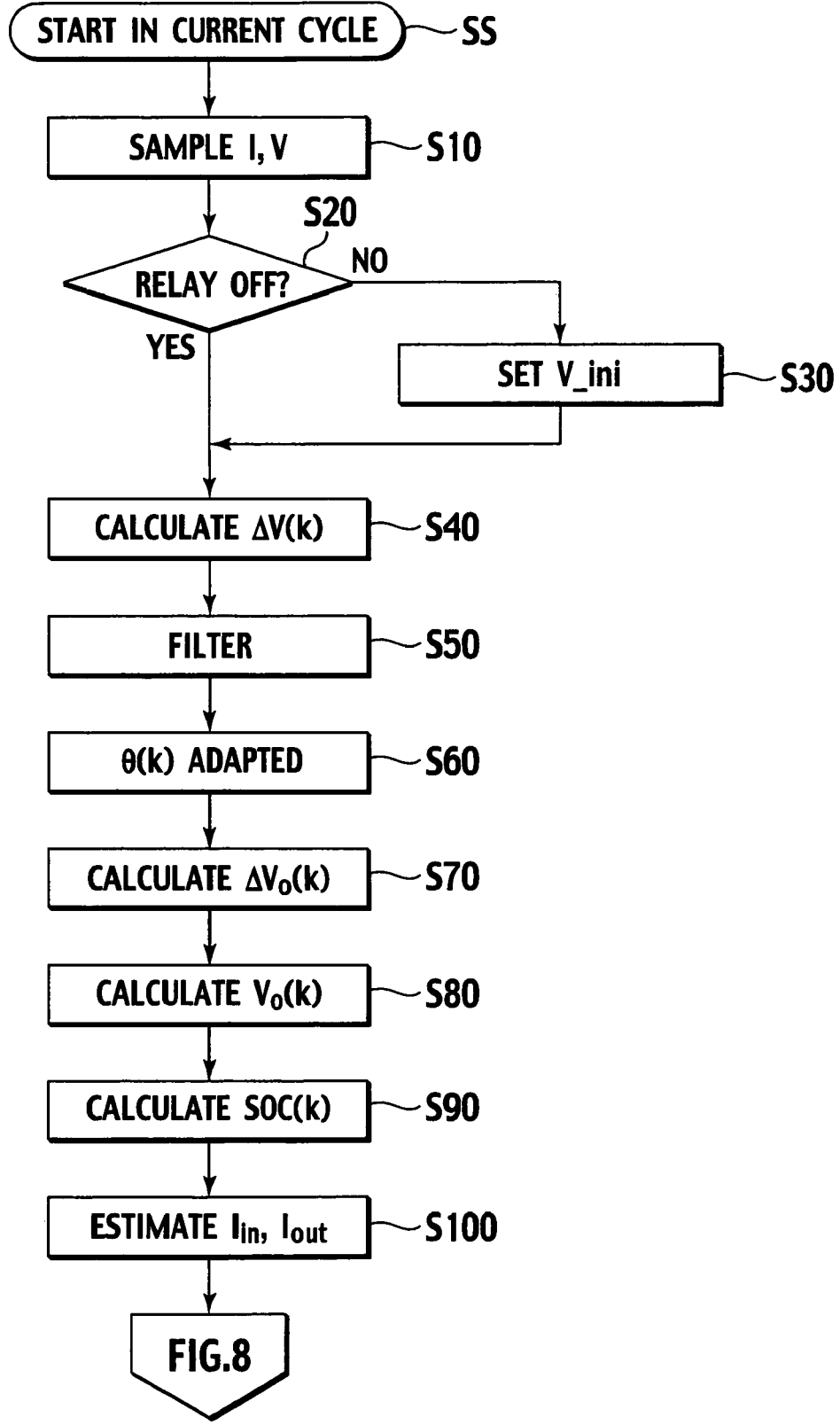
FIG. 7 is a front half of a flowchart of control actions in a control cycle for critical state estimation common to the first and second embodiments.
Figure 8:
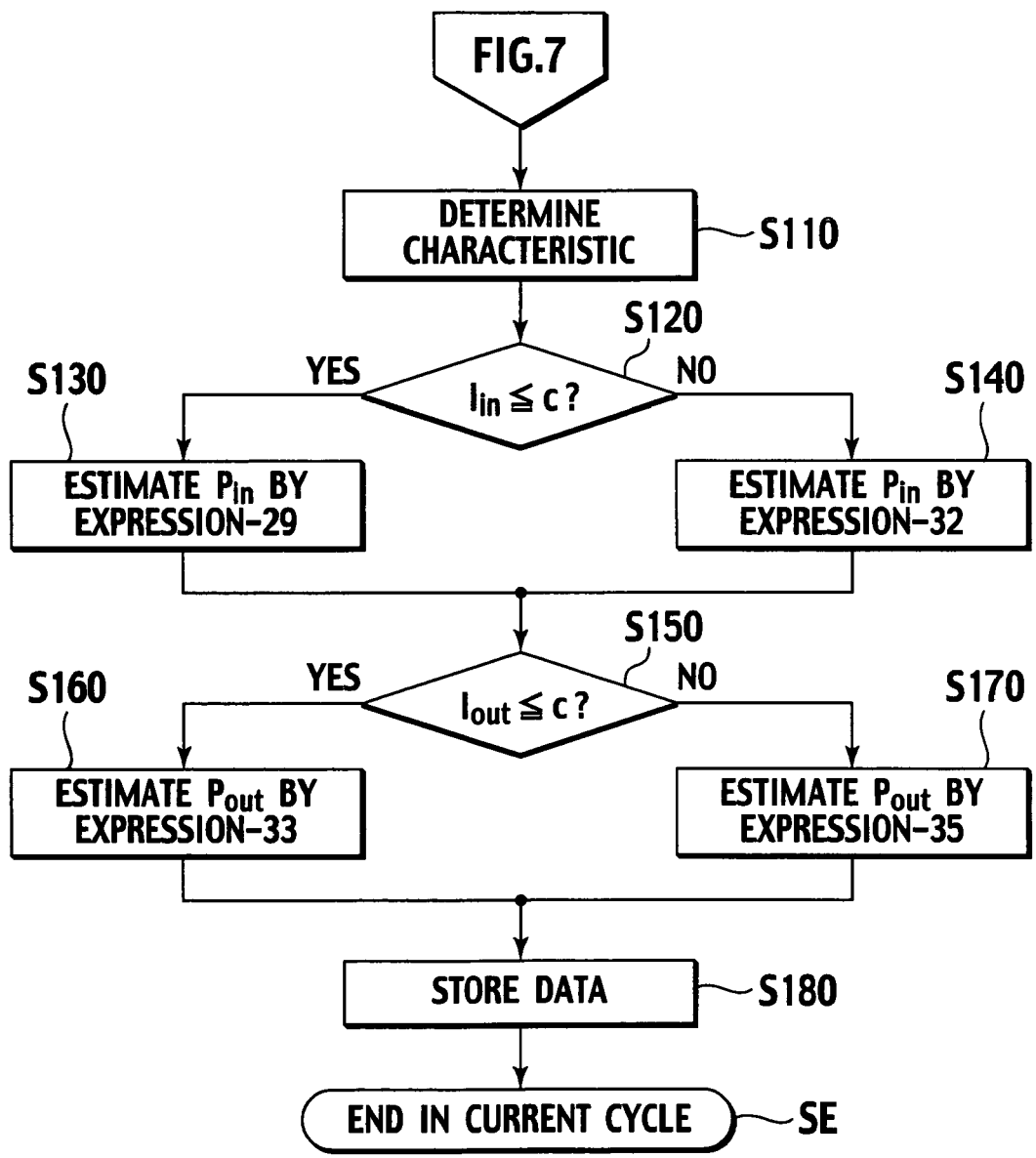
FIG. 8 is a rear half of the flowchart of FIG. 7.

FIG. 7 and FIG. 8 cooperatively show a flowchart of control actions in a control cycle for critical state estimation, of which routine is repeated at intervals of a predetermined period $T_o$.

For example, I(k) means a value of I in a current cycle, and I(k−1) means that in a previous cycle.

The current cycle starts at a step SS.

Then, at a step S10, the samplers 7 and 8 sample a battery current I(k) and a terminal voltage V(k) of the battery 10.

At a subsequent step S20, status of the relay RL is judged. If the relay RL is off (i.e. current I=0), the control flow goes to a step S30. When the relay RL is on, the flow goes to a subsequent step S40.

At the step S30, the terminal voltage V(k) is stored as an initial terminal voltage V_ini.

At the step S40, calculation is made to determine a difference ΔV(k) of terminal voltage V, such that $$\Delta V(k) = V(k) - V\_ini.$$

For estimation parameters of adaptive digital filter, of which initial values are set approx. 0, to be kept from divergence at a start of estimation, associated inputs are all rendered 0. If the relay RL is off, flow goes via the step S30, where I=0 and ΔV(k)=0, so that estimation parameters remain initially set.

At a subsequent step S50, the current I(k) and terminal voltage difference ΔV(k) undergo low-path filtering and/or band-path filtering processes for calculations of $I_1$ to $I_3$ and $V_1$ to $V_3$ depending on an expression-21, such that:

$$\begin{aligned} V_3 = s^2 G_{lp}(s)V & \quad V_2 = s G_{lp}(s)V \quad V_1 = G_{lp}(s)V \\ I_3 = s^2 G_{lp}(s)I & \quad I_2 = s G_{lp}(s)I \quad I_1 = G_{lp}(s)I \end{aligned}, \quad \text{(exp-21)}$$

where, $$G_{lp}(s) = \frac{1}{(ps+1)^3}.$$

At a subsequent step S60, results of calculation $I_1$ to $I_3$ and $V_1$ to $V_3$ at the step S50 are substituted in expression-20, to estimate parameter θ(k), providing $y = V_2$, $\omega^{trans} = [V_3 I_3 I_2 I_1,]$, and $\theta^{trans} = [-T_1 K T_2 K h]$, whereby the internal resistance K is estimated, as well as other elements of vector parameters.

At a subsequent step S70, results of estimation $-T_1$, $KT_2$, K, and h of parameter θ(k) at the step S60 and $I_1$ to $I_3$ and $V_1$ to $V_3$ calculated by expression-21 at the step S50 are substituted in an expression-22, to estimate a substitute $\Delta V_o$ of terminal voltage difference ΔV(k), such that $$\begin{aligned} \Delta V_o &= G_{lp}(s) V_o & \text{(exp-22)} \\ &= G_{lp}(s)\{(T_1 s + 1)V - K(T_2 s + 1)I\} \\ &= V_1 + T_1 V_2 - K T_2 I_2 - K I_1, \end{aligned}$$

which is derived as a multiplication by $G_{lp}(s)$ of an expression $$V_o = (T_1 s + 1)V - K(T_2 s + 1)I$$

reduced from the expression-11 of battery model (FIG. 3), as this expression-11 is multiplied by the denominator and rearranged.

At a subsequent step S80, the initial value of open-circuit voltage (i.e. terminal voltage initial value V_ini) is added to a result of estimation $\Delta V_o(k)$ at the step S70, for calculation to estimate an open-circuit voltage $V_o(k)$, such that $$V_o(k) = \Delta V_o(k) + V\_ini \quad \text{(exp-23)}.$$

At a subsequent step S90, calculation is made to determine a current state of charge SOC(k) commensurate with $V_o(k)$ estimated at the step S80, in accordance with a $V_o$ vs. SOC map read from the specified data provider (SDP) 32.

Figure 9:
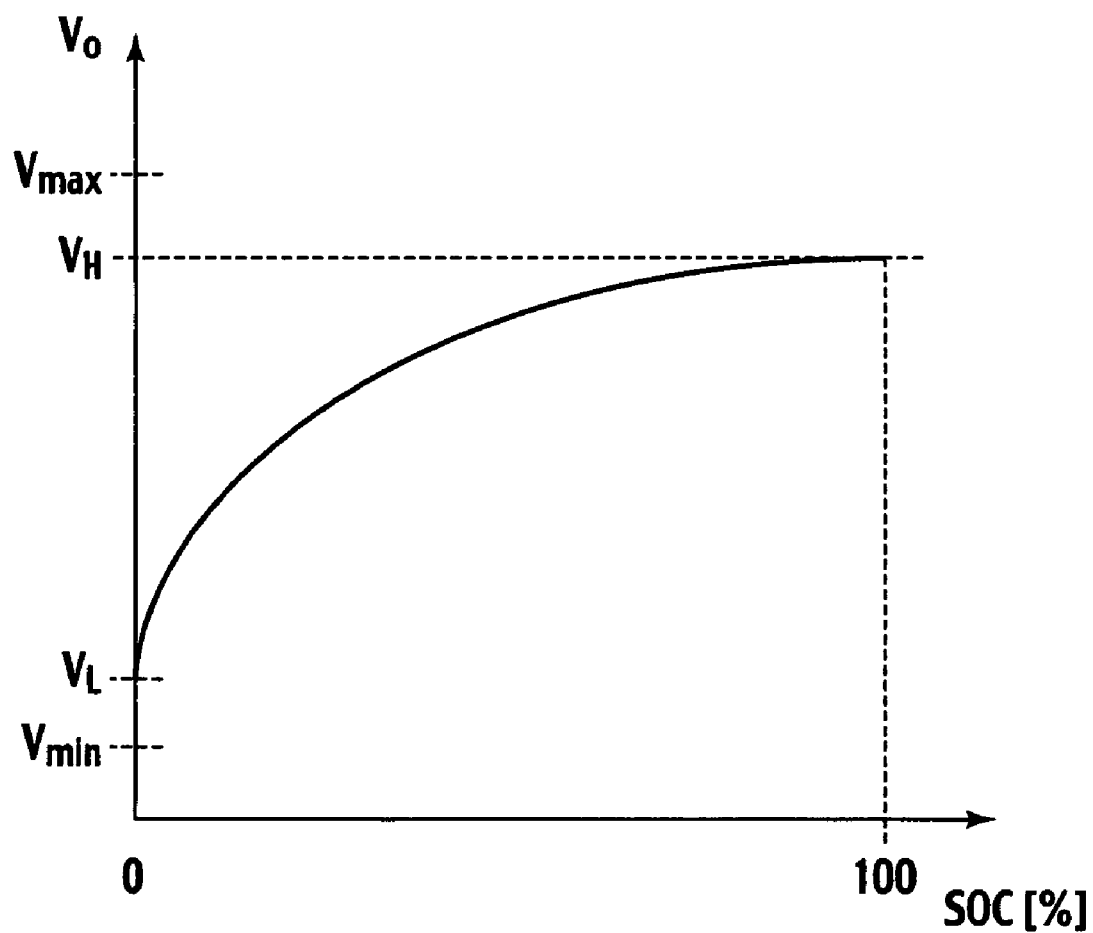
FIG. 9 is a graph of an open-circuit voltage vs. SOC field having mapped thereon a characteristic of open-circuit voltage common to the first and second embodiments.

FIG. 9 shows this map, which illustrates a $V_o$ vs. SOC characteristic curve extending from a low voltage $V_L$ (at SOC=0%) to a high voltage $V_H$ (at SOC=100%), defining a possible minimum voltage $V_{min}$ (below $V_L$) and a possible maximum voltage $V_{max}$ (above $V_H$). Those extreme voltages ($V_{min}$, $V_{max}$) are each specified in advance as a fixed limiting boundary of a permissible voltage range in charge or discharge performance of battery 10, for an ensured protection of the battery.

At a subsequent step S100, calculations are made to estimate an inputtable current $I_{in}$ and an outputtable current $I_{out}$ in the following manner.

The inputtable current $I_{in}$, defined as a value of current I with which the possible maximum voltage $V_{max}$ is to be reached, can be calculated by substituting the maximum voltage $V_{max}$, internal resistance K (estimated at step S60), and open-circuit voltage $V_o(k)$ (estimated at step S80) in an expression-24, such that $$V = KI + V_o \quad \text{(exp-24)},$$

which is derived as an expression of stationary battery model from the expression-11 of battery model 10 (FIG. 3), by neglecting transient characteristic terms of the latter (exp-11).

As a result, it so follows that $$I_{in} = (V_{max} - V_o^*)/K^* \quad \text{(exp-25)},$$

where, asterisk (*) is a notation for emphasis of a result of filtering estimation.

The outputtable current $I_{out}$, defined as a value of current I with which the possible minimum voltage $V_{min}$ is to be reached, can be calculated by substituting the minimum voltage $V_{min}$, internal resistance K (estimated at step S60), and open-circuit voltage $V_o(k)$ (estimated at step S80) in the expression-24, so that $$|I_{out}|=(V_o^*-V_{min})/K^* \qquad \text{(exp-26)}.$$

Then, at a step S110 (FIG. 8), it is decided which characteristic line of FIG. 4 the internal resistance K (estimated at step S60) should belong to, while selective in this embodiment is that polygonal line of which the line segment parallel to the abscissa (i.e. K=constant $d_i$:i=1 to 3) is most approached by the estimated K. That is, when residing within a non-variable range of I-K characteristic (i.e. in the region where $I_{in}$ or $|I_{out}|$ is smaller than $c_i$), the estimated K is compared with the constant $d_i$ for decision of the selection. Selective characteristic line may be that of which the constant $d_i$ is most approached by an average of estimation results (K) between nearest cycles (k).

It is noted that, even when the battery temperature corresponds to a characteristic-i, the estimated K does not always coincide with a specified value $d_i$ therefor.

Figure 14:
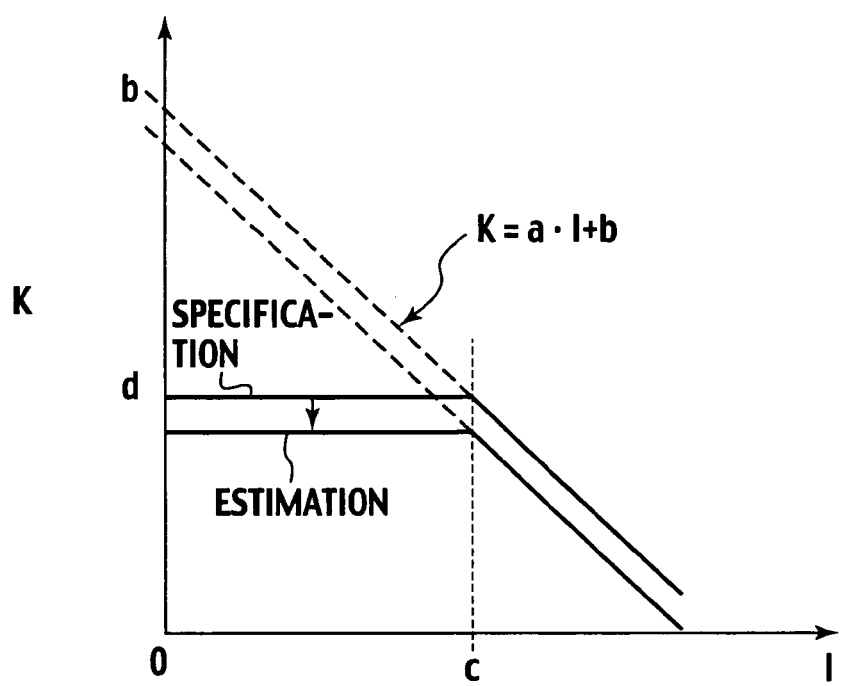
FIG. 14 is a graph of an internal resistance vs. current amplitude field having mapped thereon an effect of the first embodiment.

FIG. 14 illustrates such a case. For a characteristic-i selected, the entirety of its polygonal line (i.e. both line segments $K=a_1I+b_i$ and $K=d_i$) is shifted along the ordinate by a difference between $K^*$ and $d_i$, for subsequent use.

In FIG. 14, the shifted polygonal line is defined by an expression of its line segment, such that $$K = aI + b, \text{ where,} \qquad \text{(exp-27)}$$

$$\left. \begin{array}{l} a = a_i \\ b = K^* - ac \end{array} \right\}, \text{ where,} \qquad \text{(exp-28a)}$$

$$c = c_i. \qquad \text{(exp-28b)}$$

The constants $a_i$, $b_i$, $c_i$, and $d_i$ of polygonal line will be sometimes collectively referred to as a, b, c, and d, respectively.

Once characteristic-i is determined by selection at the step 110, the current amplitude reference value c is defined.

Then, at a decision step S120, the inputtable current $I_{in}$ is compared with the current amplitude reference value c. When $I_{in} \leq c$, the control flow goes to a step S130. If $I_{in}>c$, the flow goes to a step S140.

At the step S130, as residing in the region of constant K (i.e. $0 \leq I_{in} \leq c$) the inputtable current $I_{in}$ (estimated at step S100) is substituted in an expression-29 for calculation to estimate inputtable power $P_{in}$, such that $$P_{in}=I_{in}V_{max}=\{(V_{max}-V_o^*)/K^*\}V_{max} \qquad \text{(exp-29)}.$$

At the step S140, the inputtable current $I_{in}$ (estimated at step S100) resides in the region of non-constant K (i.e. $c<I_{in}$), where exact K (which follows the inclined line segment K=aI+b) becomes smaller than that K (which is estimated at step S60 and employed at step S100) for estimaion of $I_{in}$, whereby this $I_{in}$ may be erroneous. To avoid this, the expression-27 (for K to be determined at step S110) is substituted in expression-24 (stationary battery model at step S100), so that $$V=(aI+b)I+V_o \qquad \text{(exp-30)},$$

In this expression-30, V and $V_o$ are replaced by $V_{max}$ (given) and $V_o(k)$ (estimated at step S80), respectively, to obtain a quadratic equation of I, such that $$aI^2+bI+(V_o^*-V_{max})=0 \qquad \text{(exp-31)},$$

of which algebraic solution gives an inputtable current $I_{in}$ anew, which is substituted in an expression-32, such that $$P_{in}=I_{in}V_{max} \qquad \text{(exp-32)},$$

where $V_{max}$ is given, so that inputtable power $P_{in}$ is determined.

At a subsequent decision step S150, the outputtable current $I_{out}$ (as absolute value estimated at step S100) is compared with the current amplitude reference value c (determined at step S110). When $I_{out} \leq c$, the control flow goes to a step S160. If $I_{out}>c$, the flow goes to a step S170.

At the step S160, as residing in the region of constant K (i.e. $0 \leq I_{out} \leq c$), the outputtable current $I_{out}$ (estimated at step S100) is substituted in an expression-33 for calculation to estimate outputtable power $P_{out}$, such that $$P_{out}=|I_{out}|V_{min}=\{(V_o^*-V_{min})/K^*\}V_{min} \qquad \text{(exp-33)}.$$

At the step S170, the outputtable current $I_{out}$ (estimated at step S100) resides in the region of non-constant K (i.e. $c<I_{out}$), where exact K=aI+b becomes smaller than the K (estimated at step S60 and employed at step S100) for estimaion of $I_{out}$, whereby this $I_{out}$ may be erroneous. To avoid this, the expression-27 (for K to be determined at step S110) is substituted in expression-24 (stationary battery model at step S100), so that V=(aI+b)I+$V_o$ . . . (exp-30), in which V and $V_o$ are replaced by $V_{min}$ (given) and $V_o(k)$ (estimated at step S80), respectively, to obtain a quadratic equation of I, such that $$aI^2+bI+(V_o^*-V_{min})=0 \qquad \text{(exp-34)},$$

of which algebraic solution gives an outputtable current $I_{out}$ anew, which is substituted in an expression-35, such that $$P_{out}=I_{out}V_{min} \qquad \text{(exp-35)},$$

where $V_{min}$ is given, so that outputtable power $P_{out}$ is determined.

At a subsequent step S180, various data are stored in memory regions of controller 30, as necessary for operation in the next cycle.

Then, at an ending step SE, the current cycle goes to an end.

According to this embodiment, if inputtable current $I_{in}$ or outputtable current $|I_{out}|$ as current magnitude is greater than constant c, once estimated internal resistance K is corrected in dependence on a current amplitude vs. internal resistance relationship, to provide a corrected K, which is based on to estimate inputtable power $P_{in}$ or outputtable power $P_{out}$, allowing even for a battery of which internal resistance depends on current amplitude to be free from the issue of an erroneous value of inputtable or outputtable power due to a difference between an estimated internal resistance during charge or discharge and an exact or real internal resistance in a current region in which the current amplitude is great, so that the inputtable or outputtable power can be estimated with a favorable accuracy.

Moreover, even for a battery of which internal resistance characteristic is greatly changed between a constant range and a non-constant range of current amplitude vs. internal resistance relationship, the estimation of inputtable or outputtable power is made, in the constant range, from an estimated internal resistance during charge or discharge, and in the non-constant range, by use of current amplitude vs. internal resistance relationship, allowing for the result of estimation to be free from errors due to the range in amplitude of charge or discharge current.

Further, the estimation is facilitated in the case of a current amplitude vs. internal resistance relationship identical between charge and discharge, as well as the case of a current amplitude vs. internal resistance relationship depending on such a simple linear expression as the combination of expression-28a and expression-28b.

Further, in the constant range of current amplitude vs. internal resistance relationship, use is made of a difference between a constant d and the estimation of internal resistance K, to thereby shift the expression of stationary battery model along the ordinate (as illustrated in FIG. 4), allowing for an accurate correction relative to the case of a fixed intercept b.

Further, the relationship among current I, terminal voltage V, and open-circuit voltage $V_o$ of a secondary cell is approximated by such a transmission function that $V=f(I)I+V_o$, allowing for application of a developed algorithm for estimation, such as an adaptive digital filter using the method of least squares or trace gain limited at both sides, permitting a concurrent estimation of unknown parameter factors or coefficients of polynominal (e.g. A(s) or B(s)), which allows substitution of estimation results in the transmission function to estimate the open-circuit voltage $V_o$ in a facilitated manner.

Such unknowns are always variable with time under influences such as of SOC, battery temperature, and degree of deterioration, but can be successively estimated with a favorable accuracy by an adaptive digital filter that exactly estimates the internal resistance K and open-circuit voltage $V_o$, of which results are employed for estimation of inputtable and outputtable power to be accurate.

Figure 10:
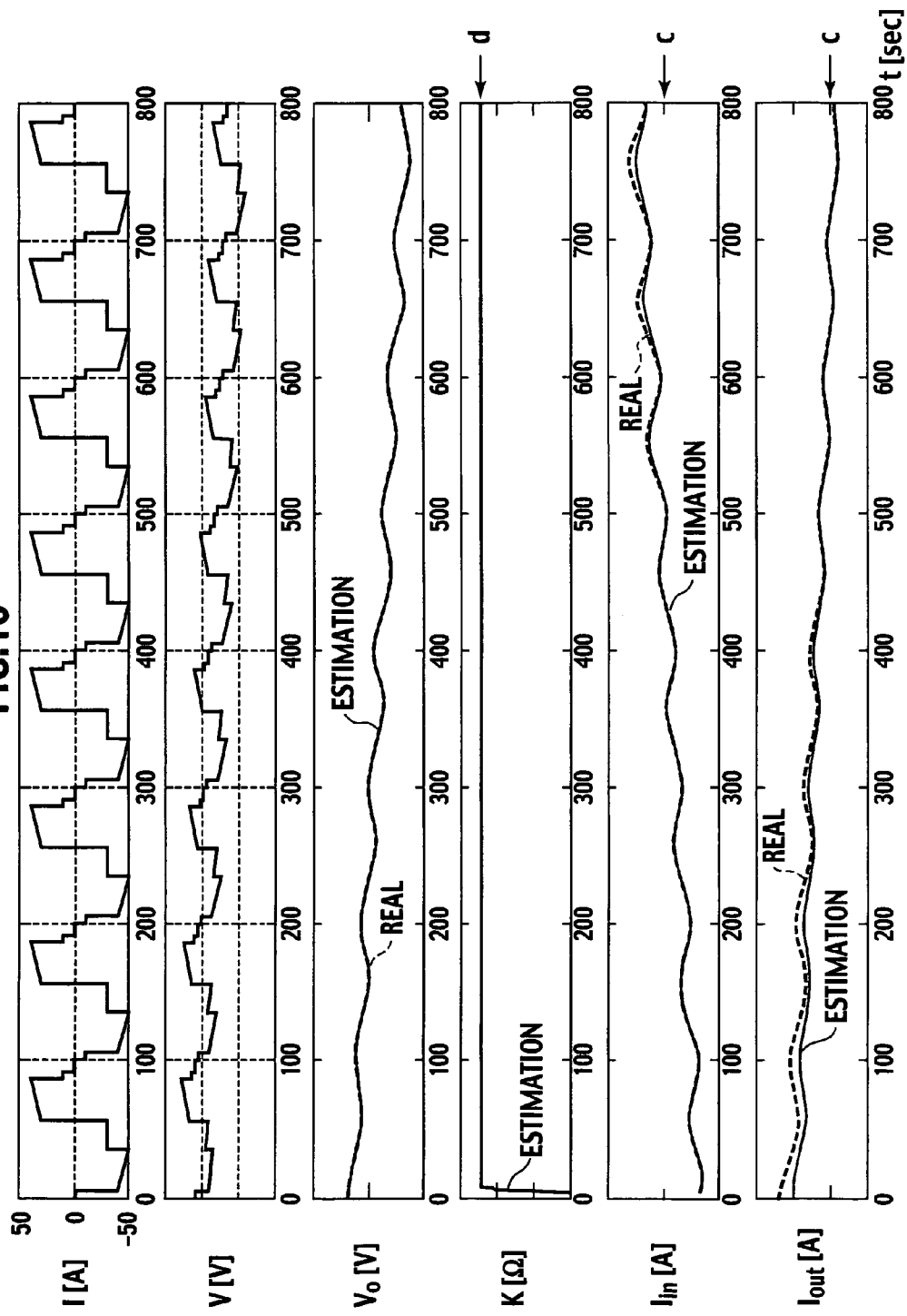
FIG. 10 is a combination of time charts of variants, parameters, and critical current values in a simulation of conventional art.
Figure 11:
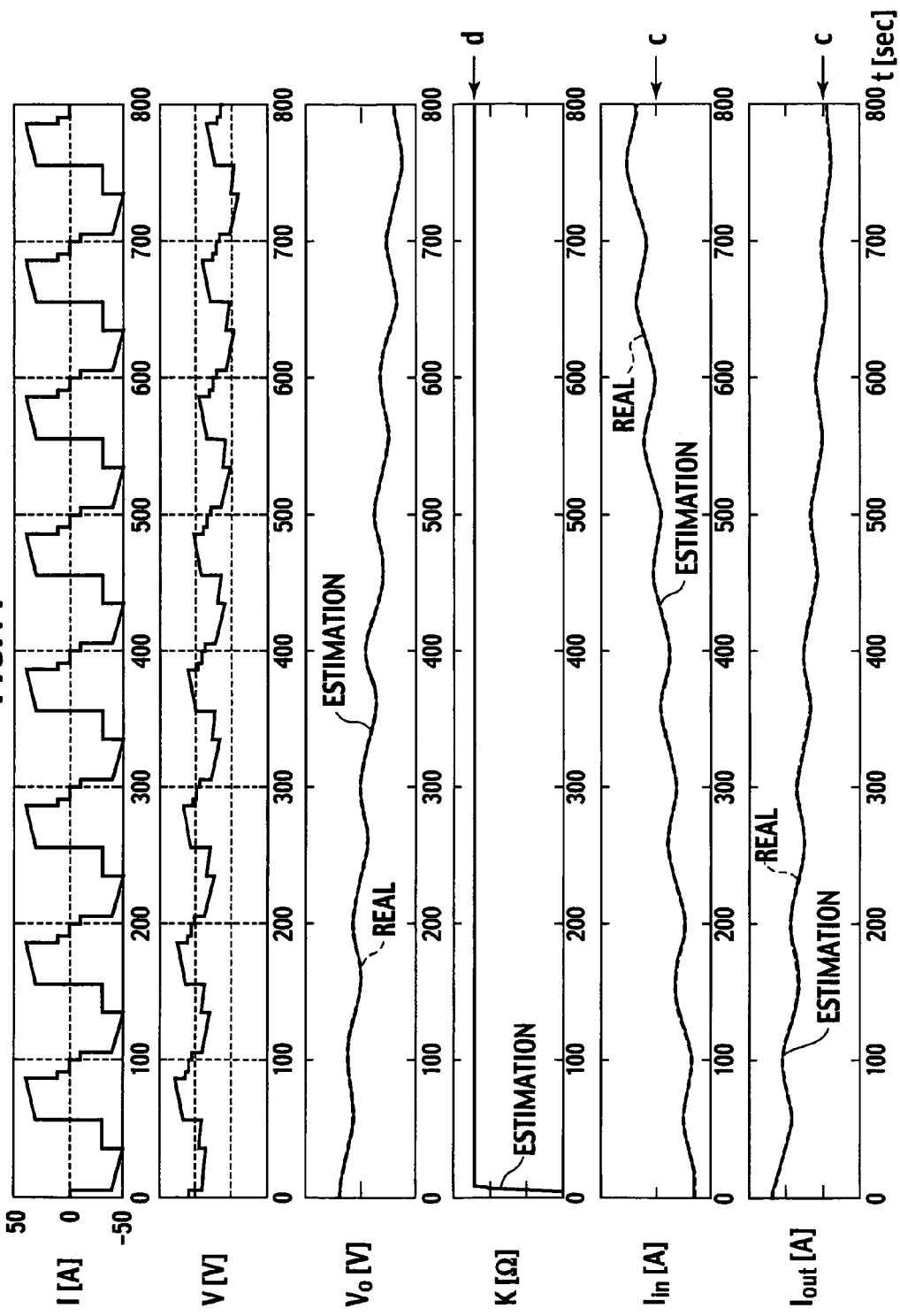
FIG. 11 is a combination of time charts of variants, parameters, and critical current values in a simulation according to the first embodiment.
Figure 12:
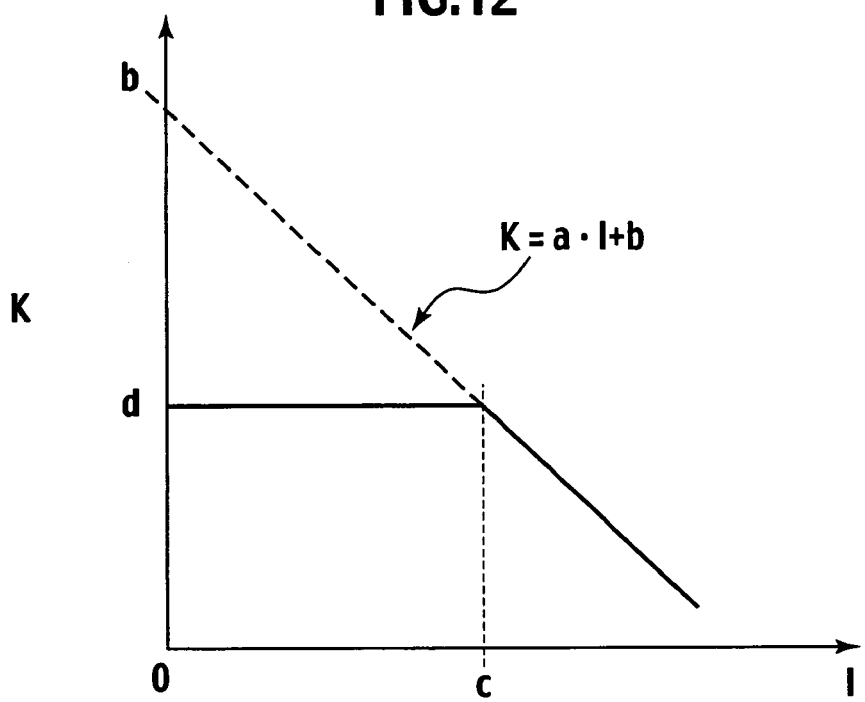
FIG. 12 is a graph of an internal resistance vs. current amplitude field having mapped thereon a non-linear characteristic of internal resistance used in the simulations of FIG. 10 and FIG. 11.

Description is now made of simulations for comparison between the embodiment described and a conventional method (JPA'063), with reference to FIGS. 10-12.

FIG. 10 shows, in a combination of time charts, results (I, V, $V_o$, K, $I_{in}$, $I_{out}$) of a simulation of the conventional method; FIG. 11 shows, in a combination of time charts, results (I, V, $V_o$, K, $I_{in}$, $I_{out}$) of a simulation of the embodiment; and FIG. 12 shows, on an internal resistance (K) vs. current amplitude (I) field, a non-linear characteristic of internal resistance (K) mapped thereon and employed for the simulations of FIGS. 10 and 11.

For a remarkable difference, the employed battery (10) has an intended characteristic (i.e. K=d for I≦C, and K=aI+b for c<I), so that, as in FIG. 12, the internal resistance K is varied simply in a current magnitude range over the reference value c (e.g. 100A).

In the simulation of conventional method (FIG. 10), estimation of internal resistance K is based on measurements of a terminal voltage V and a current I during charge or discharge while the current amplitude resides within a range (±50A) under the reference value c, and the estimated value is converged on a real value d, which is based for estimation of an inputtable current. In the range under c, the internal resistance K is constant and coincident with the rear value. However, for a range over c in which the real internal resistance decreases, but the internal resistance K estimated during charge or discharge is based to estimate an inputtable current $I_{in}$, of which estimation result is thus different from the real value. Accordingly, inputtable power estimated from the inputtable current $I_{in}$ has an error to the real value. For outputtable current $I_{out}$, either, the estimation coincides with a real value in the current amplitude range under c, but is different therefrom in the current amplitude range over c. As a result, outputtable power estimated from the outputtable current $I_{out}$ also has an error to the real value.

In the simulation of embodiment (FIG. 11), in which also estimation of internal resistance K is based on measurements of a terminal voltage V and a current I during charge or discharge while the current amplitude resides within a range (±50A) under the reference value c, the estimated value is converged on a real value d. For inputable current $I_{in}$ in the current amplitude range under c, where real internal resistance is constant, the estimation of $I_{in}$ coincides with a real value even when based on an estimated internal resistance K. For the current amplitude range over c in which real internal resistance decreases, the embodiment does not use the estimated internal resistance K during charge or discharge, but employs an inputtable current $I_{in}$ estimated anew using the characteristic K of FIG. 12, so that inputtable power estimated from this inputtable current $I_{in}$ has no error to the real value. Also for outputtable current $I_{out}$, the estimation coincides with a real value in the current amplitude range over c, as well as in that under c. As a result, outputtable power estimated from the outputtable current $I_{out}$ has no error to the real value, either.

Figure 5:
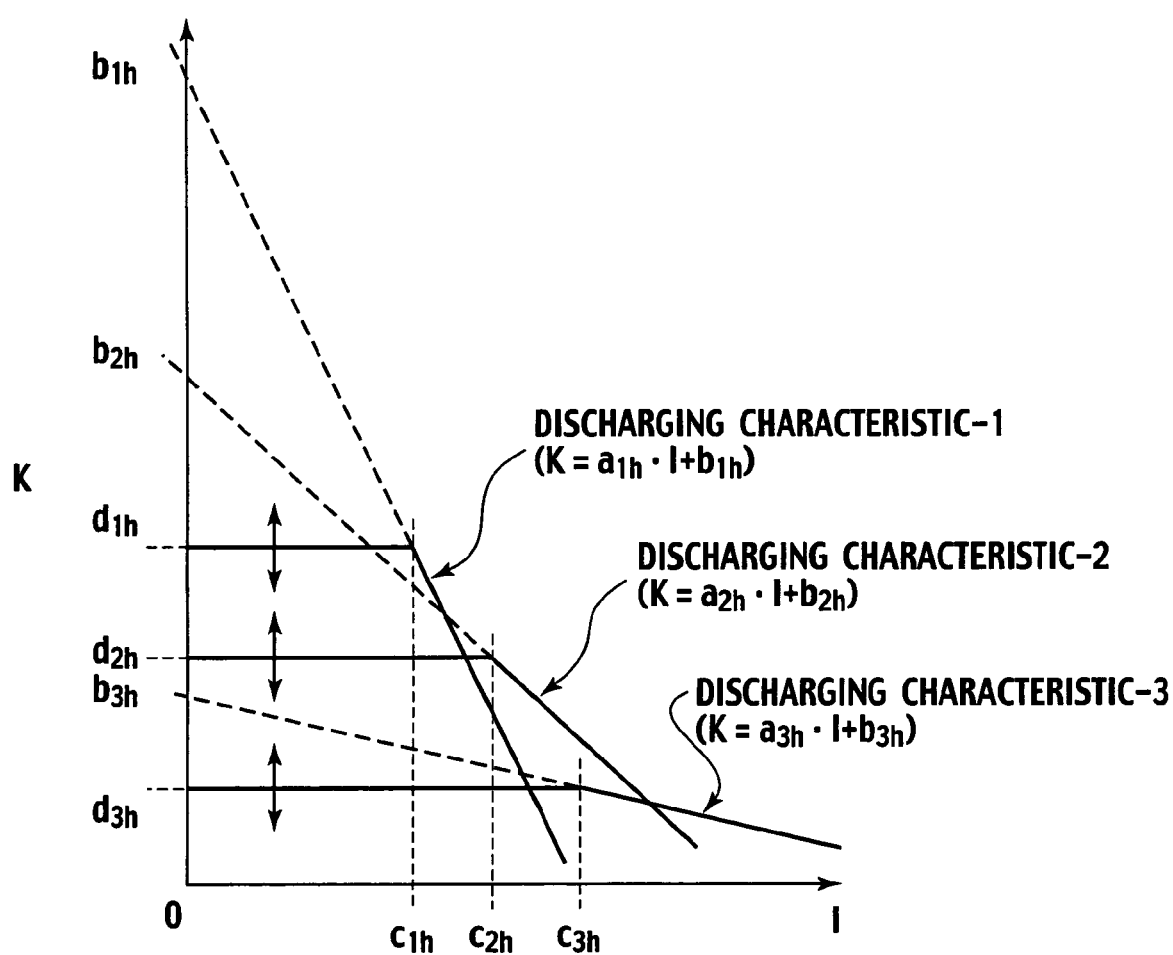
FIG. 5 is a graph of an internal resistance vs. charge current field having mapped thereon non-linear characteristics of internal resistance according to a second embodiment of the invention.
Figure 6:
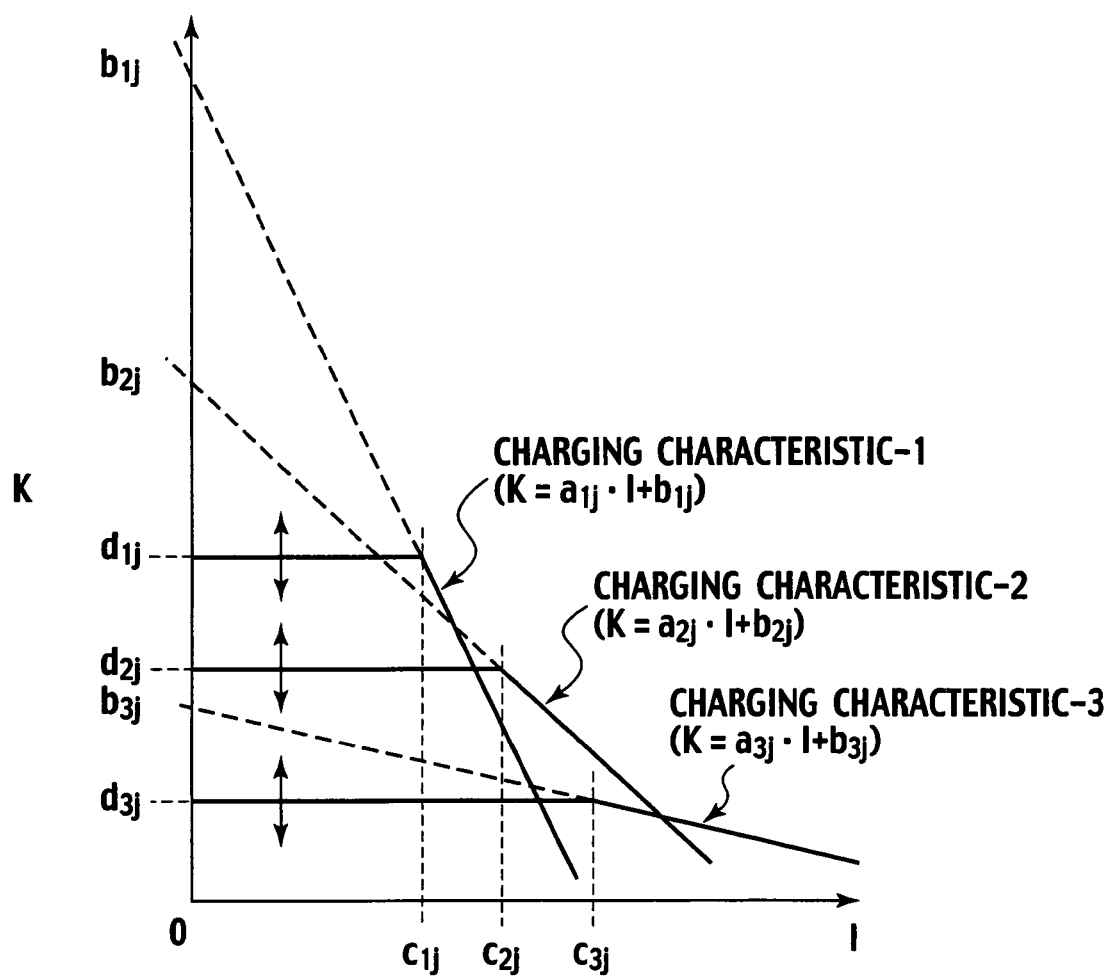
FIG. 6 is a graph of an internal resistance vs. discharge current field having mapped thereon non-linear characteristics of internal resistance according to the second embodiment.

Description is now made of a second embodiment of the invention, with reference to FIGS. 1-3 for configuration and function, FIGS. 5-6 for characteristics, and FIGS. 7-9 and 13 for control.

FIG. 5, as well as FIG. 6, shows, in a filed of two-dimensional coordinate plane defined by internal resistance K (on ordinate) and current amplitude I (on abscissa), a multi-dimensional non-linear dynamic characteristic of internal resistance K mapped thereon under conditions of constant battery temperature and constant SOC. Data on this map or K itself are separately prepared and stored in a memory of controller 30, to be read for substitution with a most approached estimation result.

In FIG. 5, the dynamic characteristic of K appears as a combination of three different characteristic lines for different temperatures:

a discharging characteristic-1 of K defined by a polygonal line, such that $K=d_{1h}$ for $0 \leq I \leq c_{1h}$, and $K=a_{1h}I+b_{1h}$ for $c_{1h}<I$;

a discharging characteristic-2 of K defined by a polygonal line, such that $K=d_{2h}$ for $0 \leq I \leq c_{2h}$, and $K=a_{2h}I+b_{2h}$ for $c_{2h}<I$; and a discharging characteristic-3 of K defined by a polygonal line, such that $K=d_{3h}$ for $0 \leq I \leq c_{3h}$, and $K=a_{3h}I+b_{3h}$ for $c_{3h}<I$, where, $a_{1h}$, $a_{2h}$, and $a_{3h}$ are slopes of straight line segments of polygonal lines in regions ($c_{ih}<I$, i=1 to 3) of discharge current I exceeding abscissas $c_{1h}$, $c_{2h}$, and $c_{3h}$ of polygonal vertices, respectively, $b_{1h}$, $b_{2h}$, and $b_{3h}$ are K-intercepts of extraporations of the straight line segments of polygonal lines, respectively, and $d_{1h}$, $d_{2h}$, and $d_{3h}$ are levels of straight line segments of polygonal lines in regions ($I \leq c_{ih}$) of discharge current I not exceeding the abscissas $c_{1h}$, $c_{2h}$, and $c_{3h}$ of polygonal vertices, respectively, while the levels $d_{1h}$, $d_{2h}$, and $d_{3h}$ are each variable (as illustrated by vertical arrows) with a varying SOC.

In FIG. 6, the dynamic characteristic of K appears as a combination of three different characteristic lines for different temperatures:

a charging characteristic-1 of K defined by a polygonal line, such that $K=d_{1j}$ for $0 \leq I \leq c_{1j}$, and $K=a_{1j}I+b_{1j}$ for $c_{1j}<I$;

a charging characteristic-2 of K defined by a polygonal line, such that $K=d_{2j}$ for $0 \leq I \leq c_{2j}$, and $K=a_{2j}I+b_{2j}$ for $c_{2j<I}$, and a charging characteristic-3 of K defined by a polygonal line, such that $K=d_{3j}$ for $0 \leq I \leq c_{3j}$, and $K=a_{3j}I+b_{3j}$ for $c_{3j}<I$, where, $a_{1j}$, $a_{2j}$, and $a_{3j}$ are slopes of straight line segments of polygonal lines in regions ($c_{ij}<I$, i=1 to 3) of charge current I exceeding abscissas $c_{1j}$, $c_{2j}$, and $c_{3j}$ of polygonal vertices, respectively, $b_{1j}$, $b_{2j}$, and $b_{3j}$ are K-intercepts of extraporations of the straight line segments of polygonal lines, respectively, and $d_{1j}$, $d_{2j}$, and $d_{3j}$ are levels of straight line segments of polygonal lines in regions ($I \leq c_{ij}$) of charge current I not exceeding the abscissas $c_{1j}$, $c_{2j}$, and $c_{3j}$ of polygonal vertices, respectively, while the levels $d_{1j}$, $d_{2j}$, and $d_{3j}$ are each variable (as illustrated by vertical arrows) with a varying SOC.

It is noted that the internal resistance K has a different characteristic between the discharging side (FIG. 5), where an outputtable current $I_{out}$ is estimated, and the charging side (FIG. 6), where an inputtable current $I_{in}$ is estimated.

Control actions in this embodiment are like to the first embodiment for steps S10 to S100 in FIG. 7, but are different therefrom in FIG. 8.

At a step S110 (FIG. 8), it is decided which characteristic line of FIGS. 5-6 the internal resistance K (estimated at step S60) should belong to, while selective also in this embodiment, for example at the discharging side (FIG. 5), is that polygonal line of which the line segment parallel to the abscissa (i.e. K=constant $d_{ih}$:i=1 to 3) is most approached by the estimated K.

It is noted that, even when the battery temperature corresponds to a discharging or charging characteristic-i, the estimated K does not always coincide with a specified value $d_{ih}$ or $d_{ij}$. For a discharging or charging characteristic-i selected, the entirety of its polygonal line (i.e. both line segments $K=a_{ih}I+b_{ih}$ and $K=d_{ih}$, or $K=a_{ij}+b_{ij}$) and $K=d_{ij}$) is shifted along the ordinate by a difference between $K^*$ and $d_{ih}$ or $d_{ij}$ for subsequent use.

The shifted polygonal line is defined by an expression of its line segment, such that $$K = aI + b, \text{ where,} \qquad \text{(exp-36)}$$

$$\left. \begin{array}{l} a = a_{ih} \\ b = K^* - ac \end{array} \right\}, \text{ where,} \qquad \text{(exp-37a)}$$

$$c = c_{ih}, \text{ or} \qquad \text{(exp-37b)}$$

-continued $$\left. \begin{array}{l} a = a_{ij} \\ b = K^* - ac \end{array} \right\}, \text{ where,} \qquad \text{(exp-38a)}$$

$$c = c_{ij}. \qquad \text{(exp-38b)}$$

The constants $a_{ih}$, $b_{ih}$, $c_{ih}$, and $d_{ih}$, as well as $a_{ij}$, $b_{ij}$, $c_{ij}$, and $d_{ij}$, of polygonal line will also be sometimes collectively referred to as a, b, c, and d, respectively.

Once discharging or charging characteristic-i of K is determined by selection at the step 110, the discharge or charge current's amplitude reference value c is defined.

Then, at a decision step S120, the inputtable current $I_{in}$ is compared with the current amplitude reference value c (exp-38b). When $I_{in} \leq c$, the control flow goes to a step S130. If $I_{in}>c$, the flow goes to a step S 140.

At the step S130, as residing in the region of constant K (i.e. $0 \leq I_{in} \leq c$), the inputtable current $I_{in}$ (estimated at step S100) is substituted in an expression-39 for calculation to estimate inputtable power $P_{in}$, such that $$P_{in}=I_{in}V_{max}=\{(V_{max}-V_o^*)/K^*\}V_{max} \qquad \text{(exp-39)}.$$

At the step S140, the inputtable current $I_{in}$ (estimated at step S100) resides in the region of non-constant K (i.e. $c<I_{in}$), where exact K becomes smaller than that K (estimated at step S60 and employed at step S100) for estimaion of $I_{in}$, whereby this $I_{in}$ may be erroneous. To avoid this, the charging chracteristic-i of K determined at step S110 (expression-36, expression-38a, and expression-38b) is substituted in expression-24 (stationary battery model at step S100), so that $$V=(aI+b)I+V_o \qquad \text{(exp-40)},$$

In this expression-40, V and $V_o$ are replaced by $V_{max}$ (given) and $V_o(k)$ (estimated at step S80), respectively, to obtain a quadratic equation of I, such that $$aI^2+bI+(V_o^*-V_{max})=0 \qquad \text{(exp-41)},$$

of which algebraic solution gives an inputtable current $I_{in}$ anew, which is substituted in an expression-42, such that $$P_{in}=I_{in}V_{max} \qquad \text{(exp-42)},$$

where $V_{max}$ is given, so that inputtable power $P_{in}$ is determined. It is noted that, in expression-41, a and b each denotes that in charging characteristic-i of K (expression-38a and expression-38b).

At a subsequent decision step S150, the outputtable current $I_{out}$ (as absolute value estimated at step S100) is compared with the current amplitude reference value c (determined by expression-37a and expression-37b at step S110). When $I_{out} \leq c$, the control flow goes to a step S160. If $I_{out}>c$, the flow goes to a step S170.

At the step S160, as residing in the region of constant K (i.e. $0 \leq I_{out} \leq c$), the outputtable current $I_{out}$ (estimated at step S100) is substituted in an expression-43 for calculation to estimate outputtable power $P_{out}$, such that $$P_{out}=I_{out}V_{min}=\{(V_o^*-V_{min})/K^*\}V_{min} \qquad \text{(exp-43)}.$$

At the step S170, the outputtable current $I_{out}$ (estimated at step S100) resides in the region of non-constant K (i.e. $c<I_{out}$), where exact K=aI+b becomes smaller than the K (estimated at step S60 and employed at step S100) for estimaion of $I_{out}$, whereby this $I_{out}$ may be erroneous. To avoid this, the discharging chracteristic-i of K determined at step S110 (expression-36, expression-37a, and expression-37b) is substituted in expression-24 (stationary battery model at step S100), so that $$V = (aI+b)I + V_o \quad \text{(exp-44)},$$

in which V and $V_o$ are replaced by $V_{min}$ (given) and $V_o(k)$ (estimated at step S80), respectively, to obtain a quadratic equation of I, such that $$aI^2 + bI + (V_o^* - V_{min}) = 0 \quad \text{(exp-45)},$$

of which algebraic solution gives an outputtable current $I_{out}$ anew, which is substituted in an expression-35, such that $$P_{out} = I_{out} V_{min} \quad \text{(exp-46)},$$

where $V_{min}$ is given, so that outputtable power $P_{out}$ is determined. It is noted that, in expression-45, a and b each denotes that in discharging characteristic-i of K (expression-37a and expression-37b).

At a subsequent step S180, various data are stored in memory regions of controller 30, as necessary for operation in the next cycle. Then, at an ending step SE, the current cycle goes to an end.

Figure 13:
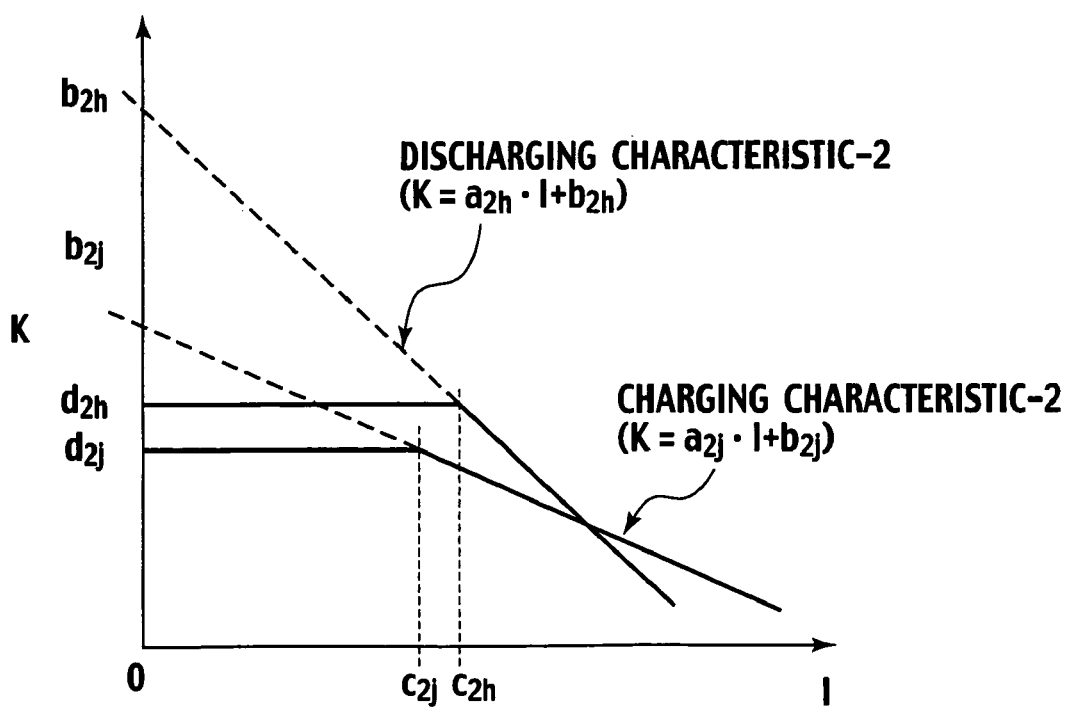
FIG. 13 is a graph of an internal resistance vs. current amplitude field having mapped thereon non-linear characteristics of internal resistance of the second embodiment.

In this embodiment, input side data is based for estimation of inputtable power $P_{in}$ and output side data is based on for estimation of outputtable power $P_{out}$, as shown in FIG. 13, which allows for high-precision estimation of inputtable and outputtable power even in the case of an internal resistance K that has a different characteristic between the input side (when charging: FIG. 6) and the output side (when discharging: FIG. 5).

Figure 15:
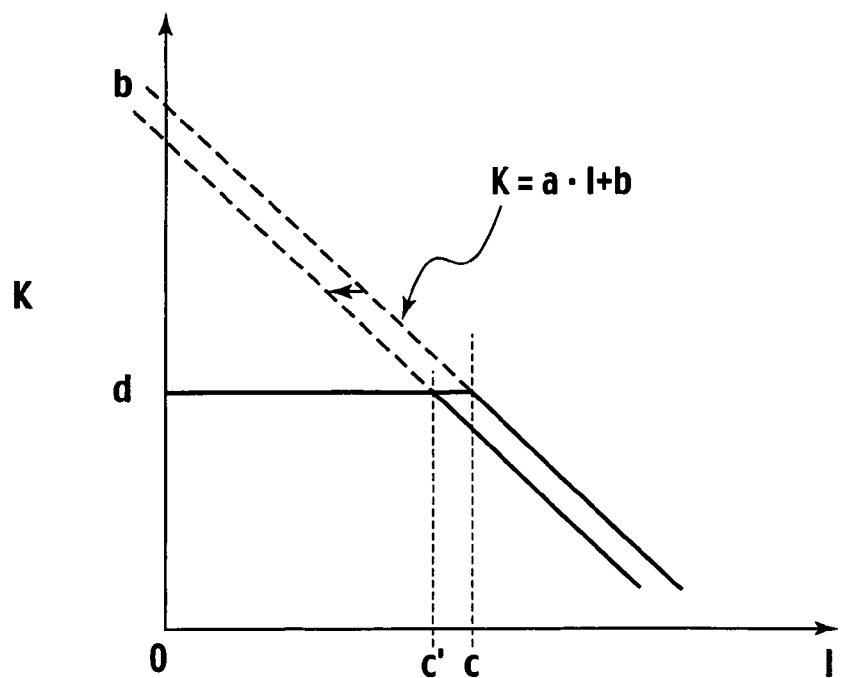
FIG. 15 is a graph of an internal resistance vs. current amplitude field having mapped thereon a non-linear characteristic of internal resistance according to a third embodiment of the invention.

Description is now made of a third embodiment of the invention, with reference to FIG. 15.

FIG. 15 shows, in an internal resistance (K) vs. current amplitude (I) field, such a non-linear characteristic of internal resistance K mapped thereon, that exhibits a hysteresis (c→c') when the magnitude of current I (i.e. I in charge or |I| in discharge) is increased to return from a K-constant region (I<c: where K=d) to a K-variable region (c<I: where K=aI+b).

More specifically, the current magnitude reference value c (as a boundary between K-constant region and K-variable region) is displaced from a normal point c (where current I passes when decreased), to a different point c' when current I increases therebeyond. That is, the K-variable region is shifted (e.g. leftward in FIG. 15), when I returns there.

Generally, such a hysteresis is defined by stored characteristic data of K. However, some hysteresis may develop with changed condition of battery 10.

Therefore, this embodiment observes a history of K vs. I relationship, and checks for a displacement of point c, when K starts variation.

If the point c is displaced, the line segment K=aI+b is displaced accordingly (i.e. at a distance of c-c' along the abscissa).

In other words, after step S100 in FIG. 7, the K vs. I relationship is corrected from $$K = aI + b \quad \text{(exp-47)}$$

to $$K = aI + b + a(c - c') \quad \text{(exp-48)},$$

as necessary.

According to this embodiment, the use of updated data on a shifted or actual reference value c' allows more accurate estimation of K than original data on a fixed reference value c.

Figure 16:
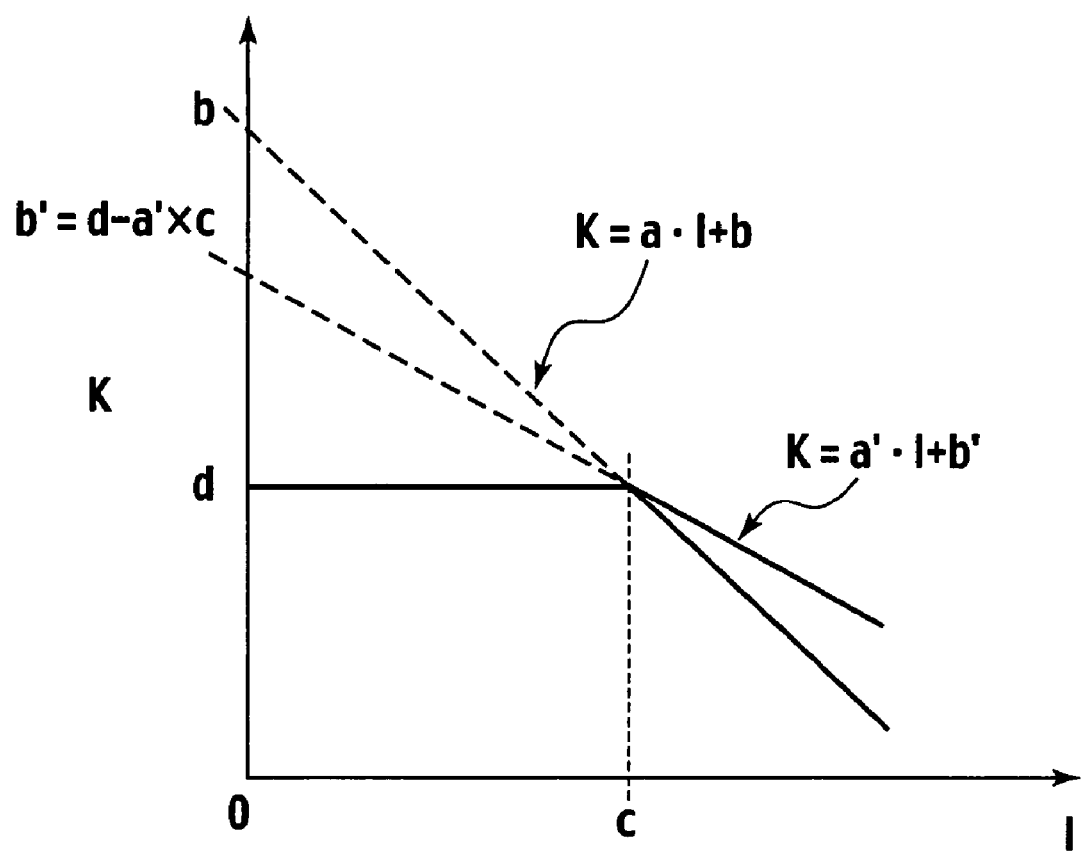
FIG. 16 is a graph of an internal resistance vs. current amplitude field having mapped thereon a non-linear characteristic of internal resistance according to a fourth embodiment of the invention.

Description is now made of a fourth embodiment of the invention, with reference to FIG. 16.

FIG. 16 shows, in an internal resistance (K) vs. current amplitude (I) field, such a non-linear characteristic of internal resistance K mapped thereon, that experiences a change or hysteresis of slope (a→a') of the line segment (K=aI+b) when the magnitude of current I (i.e. I in charge or |I| in discharge) is increased from a K-constant region (I<c: where K=d) to a K-variable region (c<I: where K=aI+b).

Generally, such a change occurs as the working condition of battery 10 changes. It however is noted that on an identical K vs. I field, other variants of K are fixed. The change of slope (a→a') in concern may occur with a change of unobserved variable of battery 10.

Therefore, this embodiment observes a history of K vs. I relationship, and checks, when K has started variation, for a change (a-a') of slope (more specifically, change in ratio of ΔK to ΔI) between a point near c and another point exceeding that point in the K-variable region, relative to an original slope a.

If the slope a is changed to a different slope a', the line segment K=aI+b is rotated accordingly (i.e. at an angle commensurate with a-a', about a coordinate (c, d)).

In other words, after step S100 in FIG. 7, the K vs. I relationship is corrected from $$K = aI + b \quad \text{(exp-49)}$$

to $$K = a'I + b' \quad \text{(exp-50)},$$

where $$b' = d - a'c,$$

as necessary.

According to this embodiment, the use of updated data on a changed or actual slope a' allows more accurate estimation of K than original data on a fixed slope a.

It is noted that the history observation of K vs. I relationship and an associated check, as well as necessary correction or compensation (exp-48, exp-50) in the third and/or fourth embodiment may preferably be performed every after a significant residual time in the K-variable region, for a reduced influence of a possible delay in estimation, allowing for the use of updated data on actual reference value c' or slope a' to achieve an accurate compensation for estimation.

While preferred embodiments of the present invention have been described using specific terms, such description is for illustrative purposes, and it is to be understood that changes and variations may be made without departing from the spirit or scope of the following claims.

What is claimed is:

1. A critical state estimation system adapted for estimation of an inputtable power of a secondary cell that defines a limiting boundary of a permissible range for power to be input to the secondary cell and an outputtable power of the secondary cell that defines a limiting boundary of a permissible range for power to be output from the secondary cell, in consideration of an internal resistance of the secondary cell, the system comprising:
   a current detector detecting a supply current from the secondary cell;
   a voltage detector detecting a supply voltage from the secondary cell;

a variable data provider configured to provide a set of variable data on the secondary cell based on the supply current and the supply voltage, the variable data including
an estimated parameter on open-circuit voltaae of the secondary cell, and
an estimated parameter on the internal resistance of the secondary cell;
a specified data provider configured to provide a set of specified data on the secondary cell, the specified data including
a specified data on a minimum voltage to be permissible under a prescribed working condition of the secondary cell, and
a specified data on a maximum voltage to be permissible under the prescribed working condition of the secondary cell; and
a critical state estimator configured to process the set of variable data and the set of specified data for estimation of the inputtable power of the secondary cell and the outputtable power of the secondary cell, the critical state estimator comprising
an internal resistance setter configured to process the estimated parameter on the internal resistance of the secondary cell to set an internal resistance of the secondary cell as a function of a current of the secondary cell,
a critical current estimator configured to process the estimated parameter on the open-circuit voltage of the secondary cell, the specified data on the minimum voltage of the secondary cell, the specified data on the maximum voltage of the secondary cell, and the internal resistance of the secondary cell as the function of the current of the secondary cell to estimate an inputtable current of the secondary cell and an outputtable current of the secondary cell within the minimum voltage of the secondary cell and the maximum voltage of the secondary cell, respectively, and
a critical power estimator configured to process the specified data on the minimum voltage of the secondary cell, the specified data on the maximum voltage of the secondary cell, the inputtable current of the secondary cell and the outputtable current of the secondary cell to estimate the inputtable power of the secondary cell and the outputtable power of the secondary cell.

2. The critical state estimation system as claimed in claim 1, wherein
the critical state comprises one of an inputable current, an outputtable current, inputtable power, and outputtable power of the secondary cell.

3. The critical state estimation system as claimed in claim 1, wherein
the internal resistance setter is configured to process the estimated parameter on the internal resistance of the secondary cell to determine a representative value of the internal resistance as a function of a representative variant of the current, and set the subset of exact data to be commensurate with the representative value of the internal resistance.

4. The critical state estimation system as claimed in claim 3, wherein
the representative variant represents a magnitude of the current.

5. The critical state estimation system as claimed in claim 4, wherein the internal resistance setter is configured for a correction of the function depending on a variable relationship between the magnitude of the current and the internal resistance.

6. The critical state estimation system as claimed in claim 5, wherein
the variable data provider comprises an internal resistance calculator for calculation to estimate the internal resistance in a non-linear manner, and to provide a result of the calculation as the estimated parameter on the internal resistance of the secondary cell, and
the internal resistance setter is configured to set the subset of exact data to be commensurate with the estimated parameter on the internal resistance of the secondary cell for the magnitude of the current not exceeding a reference value, and to be commensurate with the representative value of the internal resistance for the magnitude of the current exceeding the reference value.

7. The critical state estimation system as claimed in claim 6, wherein
the function comprises a linear expression representing a line segment defined with a slope and an intercept.

8. The critical state estimation system as claimed in claim 7, wherein
the correction of the function comprises a change of one of the slope and the intercept depending on the variable relationship.

9. The critical state estimation system as claimed in claim 7, wherein
the correction of the function comprises a shift of the line segment depending on the variable relationship.

10. The critical state estimation system as claimed in claim 5, wherein
the internal resistance setter is configured to execute the correction of the function for a significant residual time of the internal resistance in a prescribed range of the magnitude of the current.

11. The critical state estimation system as claimed in claim 2, wherein
the estimated parameter represents an open-circuit voltage of the secondary cell, and the specified data represents one of a possible maximum voltage and a possible minimum voltage of the secondary cell.

12. The critical state estimation system as claimed in claim 1, wherein
the variable data provider is configured to process the estimated parameter on the internal resistance of the secondary cell and a data on a terminal voltage of the secondary cell, for estimation of the estimated parameter on the open-circuit voltage of the secondary cell.

13. A critical state estimation method adapted for estimation of an inputtable power of a secondary cell that defines a limiting boundary of a permissible range for power to be input to the secondary cell and an outputtable power of the secondary cell that defines a limiting boundary of a permissible range for power to be output from the secondary cell, in consideration of an internal resistance of the secondary cell, the method comprising:
providing a set of variable data on the performance, including
an estimated parameter on an open-circuit voltage of the secondary cell based on a supply current from the secondary cell and a supply voltage from the secondary cell, the supply current from the secondary cell being detected by a current detector and the supply voltage from the secondary cell being detected by a voltage detector, and an estimated parameter on the internal resistance of the secondary cell; and providing a set of specified data on the secondary cell, including
- a specified data on a minimum voltage to be permissible under the prescribed working condition, and
- a specified data on a maximum voltage to be permissible under the prescribed working condition of the secondary cell; and processing the set of variable data and the set of specified data for estimation of the inputtable power of the secondary cell and the outputtable power of the secondary cell, the processing comprising
- processing the estimated parameter on the internal resistance of the secondary cell to set an internal resistance of the secondary cell as a function of a current of the secondary cell,
- processing the estimated parameter on the open-circuit voltage of the secondary cell, the specified data on the minimum voltage of the secondary cell, the specified data on the maximum voltage of the secondary cell, and the internal resistance of the secondary cell as the function of the current of the secondary cell to estimate an inputtable current of the secondary cell and an outputtable current of the secondary cell within the minimum voltage of the secondary cell and the maximum voltage of the secondary cell, respectively, and
- processing the specified data on the minimum voltage of the secondary cell, the specified data on the maximum voltage of the secondary cell, the inputtable current of the secondary cell and the outputtable current of the secondary cell to estimate the inputtable power of the secondary cell and the outputtable power of the secondary cell.

* * * * *